United States Patent
Song et al.

(10) Patent No.: US 9,627,470 B2
(45) Date of Patent: Apr. 18, 2017

(54) POWER SEMICONDUCTOR DEVICE AND METHOD OF MANUFACTURING THE SAME

(71) Applicant: SAMSUNG ELECTRO-MECHANICS CO., LTD., Suwon-Si (KR)

(72) Inventors: In Hyuk Song, Suwon-Si (KR); Jae Hoon Park, Suwon-Si (KR); Kee Ju Um, Suwon-Si (KR); Dong Soo Seo, Suwon-Si (KR)

(73) Assignee: Samsung Electro-Mechanics Co., Ltd., Suwon-Si (KR)

( * ) Notice: Subject to any disclaimer, the term of this patent is extended or adjusted under 35 U.S.C. 154(b) by 0 days.

(21) Appl. No.: 14/301,328

(22) Filed: Jun. 10, 2014

(65) Prior Publication Data

US 2015/0041884 A1 Feb. 12, 2015

(30) Foreign Application Priority Data

Aug. 9, 2013 (KR) .................. 10-2013-0094957

(51) Int. Cl.
*H01L 27/088* (2006.01)
*H01L 29/06* (2006.01)
(Continued)

(52) U.S. Cl.
CPC ........ *H01L 29/063* (2013.01); *H01L 29/0611* (2013.01); *H01L 29/0634* (2013.01);
(Continued)

(58) Field of Classification Search
CPC .............. H01L 29/0611; H01L 29/063; H01L 29/0634; H01L 29/0649; H01L 29/1095;
(Continued)

(56) References Cited

U.S. PATENT DOCUMENTS 6,566,201 B1 * 5/2003 Blanchard ........... H01L 29/0634
257/E21.418
6,686,244 B2 * 2/2004 Blanchard ........... H01L 29/0634
257/E21.418
(Continued)

FOREIGN PATENT DOCUMENTS

CN 101889327 11/2011
CN 102956707 3/2013
(Continued)

OTHER PUBLICATIONS

Office Action dated Jun. 16, 2015 for Japanese Patent Application No. 2014-124128 and its English summary provided by Applicant's foreign counsel.
(Continued)

*Primary Examiner* — Mark Tornow
*Assistant Examiner* — Priya Rampersaud
(74) *Attorney, Agent, or Firm* — Ladas & Parry, LLP

(57) ABSTRACT

There is provided a power semiconductor device including: a first semiconductor region of a first conductivity type; second semiconductor regions formed in the first semiconductor region and being of a second conductivity type; a well region formed above the second semiconductor regions and being of the second conductivity type; and a source region formed in the well region and being of the first conductivity type, wherein the second semiconductor regions include 1 to n layers formed from a lower portion of the device extending a in a direction of height of the device, and in the case that the widest width of the of the second semiconductor region of the $n^{th}$ layer is $P_n$, $P_1 < P_n$ ($n \geq 2$).

25 Claims, 23 Drawing Sheets

(51) Int. Cl.
*H01L 29/66* (2006.01)
*H01L 29/78* (2006.01)
*H01L 29/739* (2006.01)
*H01L 29/10* (2006.01)

(52) U.S. Cl.
CPC .. *H01L 29/66333* (2013.01); *H01L 29/66712* (2013.01); *H01L 29/7395* (2013.01); *H01L 29/7802* (2013.01); *H01L 29/0649* (2013.01); *H01L 29/1095* (2013.01)

(58) Field of Classification Search
CPC ......... H01L 29/66333; H01L 29/66712; H01L 29/7395; H01L 29/7802
See application file for complete search history.

(56) References Cited

U.S. PATENT DOCUMENTS

| | | | |
|---|---|---|---|
| 6,803,626 B2* | 10/2004 | Sapp | H01L 29/0634 257/329 |
| 7,291,894 B2* | 11/2007 | Sapp | H01L 29/0634 257/335 |
| 7,586,148 B2 | 9/2009 | Blanchard | |
| 2002/0008258 A1* | 1/2002 | Baba | H01L 29/408 257/273 |
| 2002/0117711 A1* | 8/2002 | Yoneda | H01L 29/7813 257/330 |
| 2002/0117715 A1* | 8/2002 | Oppermann | H01L 29/0634 257/339 |
| 2003/0181010 A1 | 9/2003 | Blanchard | |
| 2004/0056306 A1 | 3/2004 | Saito | |
| 2007/0176229 A1 | 8/2007 | Willmeroth et al. | |
| 2008/0142880 A1 | 6/2008 | Blanchard et al. | |
| 2011/0233656 A1* | 9/2011 | Ohta | H01L 29/0634 257/329 |
| 2011/0284955 A1 | 11/2011 | Sapp et al. | |
| 2013/0037852 A1 | 2/2013 | Tamaki | |

FOREIGN PATENT DOCUMENTS

| | | |
|---|---|---|
| JP | 2003-86800 A | 3/2003 |
| JP | 2005-514786 | 5/2005 |
| JP | 2005-521259 | 7/2005 |
| JP | 2007-235080 A | 9/2007 |
| JP | 2011-204796 | 10/2011 |
| KR | 10-0560710 | 3/2006 |
| KR | 10-2010-0109920 | 10/2010 |
| KR | 10-0990294 | 10/2010 |
| KR | 10-2011-0087392 A | 8/2011 |
| WO | 03/058683 | 7/2003 |
| WO | 03/058722 | 7/2003 |
| WO | 2009/073773 | 6/2009 |

OTHER PUBLICATIONS

Office Action dated Feb. 16, 2016 for Japanese Patent Application No. 2014-124128 and its English summary provided by Applicant's foreign counsel.

Office Action dated Jul. 30, 2014 for corresponding Korean Patent Application No. 10-2013-0094957 and its English summary provided by Applicant's foreign counsel.

Office Action dated Oct. 9, 2016 for Chinese Patent Application No. 201410302847.5 and its English translation provided by Applicant's foreign counsel.

* cited by examiner

POWER SEMICONDUCTOR DEVICE AND METHOD OF MANUFACTURING THE SAME

CROSS-REFERENCE TO RELATED APPLICATION

This application claims the benefit of Korean Patent Application No. 10-2013-0094957 filed on Aug. 9, 2013, with the Korean Intellectual Property Office, the disclosure of which is incorporated herein by reference in its entirety.

BACKGROUND

The present technology relates to a power semiconductor device and a method of manufacturing the same.

Generally, power semiconductor devices are widely used to control motors or as elements of various switching devices such as inverters, and the like.

In detail, the power semiconductor device, a semiconductor device used in a power apparatus, is the core component of the power apparatus optimized for converting or controlling power.

The power semiconductor device has a higher breakdown voltage, a higher current level, and a higher frequency as compared with a general semiconductor device.

As typical power semiconductor devices, there exist metal oxide semiconductor field effect transistors (MOSFETs), insulated gate bipolar transistors (IGBTs), and the like.

IGBTs and MOSFETs basically have an npn junction structure. That is, two diodes are connected to each other so that rectifying directions thereof are opposed to each other, such that a current does not flow therein at an ordinary time.

However, in the case in which a positive (+) voltage is applied to a gate formed in a manner in which it is insulated from a p-type semiconductor region using an oxide, electrons in the p-type semiconductor region are drawn, such that a conductive channel is formed in a location where the p-type semiconductor region and the oxide abut each other.

A current flows between an emitter and a collector or between a source and a drain through the conductive channel.

A MOSFET is a device having only a flow of either an electron current or a hole current, unlike an IGBT.

Representative characteristics of such a MOSFET are forward voltage drop and breakdown voltage.

In a MOSFET, since a path through which a current of the device may flow is limited to a channel, current density of the device is low, such that the forward voltage drop is large.

Further, in order to increase the breakdown voltage of the power semiconductor device in a turned-off state, a drift layer of the power semiconductor device should be thick, and a concentration of impurities thereof should be low, which inevitably causes a forward voltage drop.

In order to improve both of the forward voltage drop and the breakdown voltage with a trade-off relationship therebetween, a MOSFET having a RESURF structure has been introduced.

A RESURF structure is a structure in which p-type semiconductor regions and n-type semiconductor regions are alternately formed in a direction of width of the device or a lateral direction by forming the p-type semiconductor regions in an n-type drift layer.

In such a MOSFET having the RESURF structure, characteristics such as a high epitaxial layer concentration, a high breakdown voltage and a low forward voltage drop in a thin drift layer due to a charge compensation effect may be obtained.

Generally, when a reverse voltage is applied to the power semiconductor device, a depletion region is extended due to the presence of an electric field.

As the reverse voltage is increased, the depletion region is also increased. Therefore, space sufficient to extend the depletion region should be provided in order to obtain a high breakdown voltage.

As described above, the n-type semiconductor regions and the p-type semiconductor regions are alternately formed in the RESURF structure.

Generally, the p-type semiconductor region and the n-type semiconductor region are formed in a longitudinal direction or direction of height of the power semiconductor device so as to have a width similar to each other. However, due to limitations in the manufacturing process, a lower p-type semiconductor region has a width larger than that of the n-type semiconductor region.

In this case, the space sufficient to extend the depletion region is not present when the applied reverse voltage is gradually increased, such that the breakdown voltage is decreased.

Therefore, there is needed a power semiconductor device having a forward voltage drop effect by having a RESURF structure, and having a breakdown voltage higher than that of a power semiconductor device having a RESURF structure according to the prior art.

The following Prior art document (Patent Document 1) relates to an insulated semiconductor device and a method of manufacturing the same. However, Patent Document 1 does not disclose a feature in which each of a width and a concentration of a second conductivity type pillar is changed in the longitudinal direction or the direction of height of the device.

PRIOR ART DOCUMENT (Patent Document 1) Korean Patent Laid-Open Publication No. 2011-0087392

SUMMARY

An aspect of the present technology may provide a power semiconductor device capable of decreasing a forward voltage drop and having a high breakdown voltage, and a method of manufacturing the same.

According to an aspect of the present technology, a power semiconductor device may include: a first semiconductor region of a first conductivity type; second semiconductor regions formed in the first semiconductor region and being of a second conductivity type; a well region formed above the second semiconductor regions and being of the second conductivity type; and a source region formed in the well region and of the first conductivity type, wherein the second semiconductor regions include first to $n^{th}$ layers formed from a lower portion thereof in a longitudinal direction or direction of height of the device, and when a length of a longest portion, in a direction of width of the device or lateral direction, of the second semiconductor region of the $n^{th}$ layer is $P_n$, $P_1 < P_n$ ($n \geq 2$).

When the length of the longest portion, in the direction of width of the device or lateral direction, of the second semiconductor region of the $n^{th}$ layer is $P_n$, $P_{n-1} < P_n$ ($n \geq 2$).

When a concentration of impurities at a portion at which a concentration of second conductivity type impurities is the highest in the longitudinal direction or direction of height of the device in the second semiconductor region of the $n^{th}$ layer is $D_n$, $D_1 < D_n$ ($n \geq 2$).

The power semiconductor device may further include a trench extending through the well region into a portion of the first layer of the second semiconductor region.

According to another aspect of the present technology, a power semiconductor device may include: a first semiconductor region of a first conductivity type; second semiconductor regions formed in the first semiconductor region and being of a second conductivity type; a well region formed above the second semiconductor regions and being of the second conductivity type; and a source region formed in the well region and of the first conductivity type, wherein the second semiconductor regions include 1 to n layers formed from a lower portion of the device extending upwardly in a direction of height of the device or longitudinally, and when a concentration of impurities in a portion in which a concentration of second conductivity type impurities is the highest in the direction of height of the device or longitudinally in the second semiconductor region of the $n^{th}$ layer is $D_n$, $D_1 < D_n$ ($n \geq 2$).

When the concentration of the impurities in the portion in which the concentration of the second conductivity type impurities is the highest in the longitudinal direction or direction of height of the device in the second semiconductor region of the $n^{th}$ layer is $D_n$, $D_{n-1} < D_n$ ($n \geq 2$).

The power semiconductor device may further include a trench extending through the well region into a portion of the first layer of the second semiconductor region.

According to another aspect of the present technology, a power semiconductor device may include: a first semiconductor region of a first conductivity type; second semiconductor regions formed in the first semiconductor region and being of a second conductivity type; a well region formed above the second semiconductor regions and being of the second conductivity type; and a source region formed in the well region and of the first conductivity type, wherein the second semiconductor regions include first to $n^{th}$ layers formed from a lower portion of the device in a longitudinal or direction of height of the device, the power semiconductor device further comprising a trench extending through the well region into a portion of the first layer of the second semiconductor region.

The trench may have a width that is wider at an upper portion thereof than at a lower portion thereof.

The trench may have a tapered shape or a stair shape.

The trench may be filled with at least one of a second conductivity type material and silicon oxide.

A concentration of impurities of the second semiconductor region in a portion at which the second semiconductor region and the trench abut each other may become lower toward the trench in the lateral direction or the direction of width of the device.

According to another aspect of the present technology, a power semiconductor device may include: a first semiconductor region of a first conductivity type; second semiconductor regions formed in the first semiconductor region and being of a second conductivity type; a well region formed above the second semiconductor regions and being of the second conductivity type; and a source region formed in the well region and being of the first conductivity type, wherein the second semiconductor regions include first to $n^{th}$ layers formed from a lower portion thereof in a longitudinal direction or direction of height of the device, and when a length of a longest gap, in a lateral direction or direction of width of the device, of a depletion region formed in the second semiconductor region of the $n^{th}$ layer is $R_n$, $R_1 < R_n$ ($n \geq 2$).

When the length of the longest gap, in the lateral direction or the direction of width of the device, of the depletion region formed in the second semiconductor region of the $n^{th}$ layer is $R_n$, $R_{n-1} < R_n$ ($n \geq 2$).

According to another aspect of the present technology, a power semiconductor device may include: a first semiconductor region of a first conductivity type; RESURF layers formed in the first semiconductor region and being of second semiconductor regions and third semiconductor regions alternately formed in a lateral direction or direction of width of the device, the second semiconductor regions being of a second conductivity type and the third semiconductor regions being of the first conductivity type; a well region formed above the second semiconductor regions and being of the second conductivity type; and a source region formed in the well region and of the first conductivity type, wherein the RESURF layers include first to $n^{th}$ RESURF layers formed from a lower portion thereof in a longitudinal direction or direction of height of the device, when a length of a shortest portion, in the lateral direction or direction of width of the device, of the third semiconductor region formed in the $n^{th}$ RESURF layer is $Q_n$, $Q_1 > Q_n$ ($n \geq 2$).

In the case that the length of the shortest portion, in the lateral direction or the direction of width of the device, of the third semiconductor region formed in the $n^{th}$ RESURF layer is $Q_n$, $Q_{n-1} > Q_n$ ($n \geq 2$).

When a concentration of impurities at a portion at which a concentration of second conductivity type impurities is the highest in the longitudinal direction or the direction of height of the device in the second semiconductor region of the $n^{th}$ RESURF layer is $D_n$, $D_1 < D_n$ ($n \geq 2$).

The power semiconductor device may further include a trench extending through the well region into a portion of the second semiconductor region of the first RESURF layer.

According to another aspect of the present technology, a method of manufacturing a power semiconductor device may include: preparing a first semiconductor region of a first conductivity type; forming a second semiconductor region of an $n^{th}$ layer by etching portions of the first semiconductor region and implanting second conductivity type impurities; forming a second semiconductor region of an $(n-1)^{th}$ layer by etching portions of the first semiconductor region from the second semiconductor layer of the $n^{th}$ layer and implanting the second conductivity type impurities; adding a fill material in the etched portions; forming a well region over the second semiconductor regions by implanting the second conductivity type impurities; and forming a source region in the well region by implanting first conductivity type impurities, wherein the forming of the second semiconductor region of the $(n-1)^{th}$ layer is repeatedly performed until $n-1$ becomes 1.

The fill material may be a second conductivity type material or silicon oxide.

At least one of the forming of the second semiconductor region of the $n^{th}$ layer and the forming of the second semiconductor region of the $(n-1)^{th}$ layer may include implanting and heat treating the second conductivity type impurities.

In forming the second semiconductor region of the $n^{th}$ layer and forming the second semiconductor region of the $n-1)^{th}$ layer, when a concentration of the second conductivity type impurities implanted into the $n^{th}$ layer is $I_n$, the second conductivity type impurities may be implanted so as to satisfy the following Equation: $I_1 < I_n$ ($n \geq 2$).

BRIEF DESCRIPTION OF DRAWINGS

The above and other aspects, features and other parts of the present technology will be more clearly understood from the following detailed description taken in conjunction with the accompanying drawings, in which.

DETAILED DESCRIPTION

Figure 1:
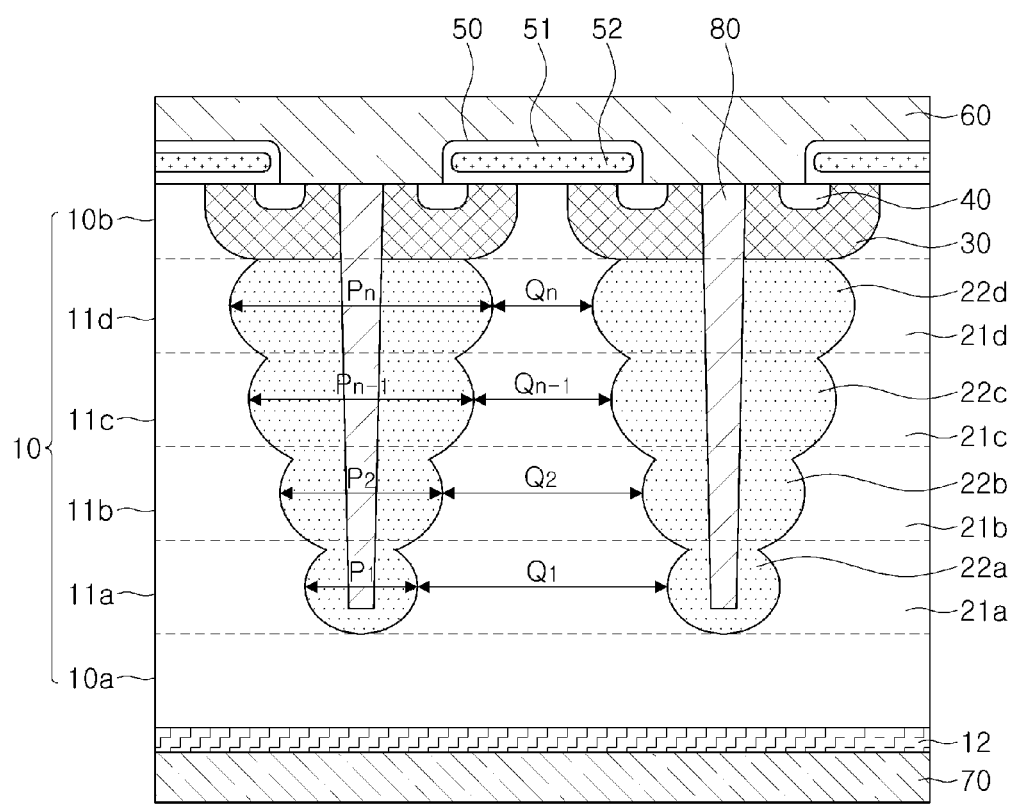
FIG. 1 is a schematic, cross-sectional view of a power semiconductor device according to an exemplary embodiment of the present technology.

Hereinafter, embodiments of the present technology will be described in detail with reference to the accompanying drawings. The disclosure may, however, be embodied in many different forms and should not be construed as being limited to the embodiments set forth herein. Rather, these embodiments are provided so that this disclosure is thorough and complete and conveys the general scope of the disclosure to those skilled in the art. In the drawings, the shapes and dimensions of elements may be exaggerated for clarity; the same reference numerals will be used throughout to designate the same or like elements.

A power switch may be implemented by any one of a power metal oxide semiconductor field effect transistor (MOSFET), an insulated gate bipolar transistor (IGBT), several types of thyristors, and devices similar to the foregoing devices. Most of the new technologies disclosed herein will be described based on the MOSFET. However, several exemplary embodiments of the present technology disclosed herein are not limited to the MOSFET, but may also be applied to other types of power switch technologies including a power IGBT and several types of thyristors in addition to the MOSFET. Further, several exemplary embodiments of the present technology will be described as including specific p-type and n-type regions. However, conductivity types of several regions disclosed herein may be similarly applied to devices having conductivity types opposite thereto.

In addition, n-type or p-type as used herein may be defined as a first conductivity type or a second conductivity type. Meanwhile, the first and second conductivity types mean different conductivity types as compared to each other.

Further, generally, '+' means a state in which a region is heavily doped and '−' means a state in which a region is lightly doped.

A depletion region used herein means a region in which carriers are not present due to combinations between electrons and holes caused by abutment between semiconductor regions having different conductivity types.

FIG. 1 is a schematic, cross-sectional view of a power semiconductor device according to an exemplary embodiment of the present technology.

A structure of a power semiconductor device according to an exemplary embodiment of the present technology is described with reference to FIG. 1.

A power semiconductor device according to an exemplary embodiment of the present technology may include a drift layer 10a, 10b, a first semiconductor region 10, a well region 30 having a second conductivity type, and a source region 40 having a first conductivity type.

In detail, the power semiconductor device according to an exemplary embodiment of the present technology may include the first semiconductor region 10 of a first conductivity type; second semiconductor regions 22a, 22b, 22c, and 22d formed in the first semiconductor region 10 and of a second conductivity type; the well region 30 formed above the second semiconductor regions 22a, 22b, 22c, and 22d and of the second conductivity type; and the source region 40 formed in the well region 30 and of the first conductivity type, wherein the second semiconductor regions 22a, 22b, 22c, and 22d include 1 to n layers formed from a lower portion thereof and extend upwardly in the direction of height of the device.

The first semiconductor region 10 may serve as a drift layer.

The semiconductor region 10 may include a first drift layer 10a, 1 to n RESURF layers 11a, 11b, 11c, and 11d, and a second drift layer 10b formed in the direction of height of the device.

The second semiconductor regions 22a, 22b, 22c, and 22d may include the first to $n^{th}$ layers formed from the lower portion of the device viewing it along the height of the device.

In addition, the power semiconductor device according to an exemplary embodiment of the present technology may include the first semiconductor region 10 being of the first conductivity type; RESURF layers 11a, 11b, 11c, and 11d formed in the first semiconductor region 10 and having second semiconductor regions 22a, 22b, 22c, and 22d and third semiconductor regions 21a, 21b, 21c, and 21d alternately formed in the direction of width of the device, the second semiconductor regions 22a, 22b, 22c, and 22d being of the second conductivity type and the third semiconductor regions 21a, 21b, 21c, and 21d being of the first conductivity type; the well region 30 formed above the second semiconductor regions 22a, 22b, 22c, and 22d and being of the second conductivity type; and the source region 40 formed in the well region 30 and being of the first conductivity type, wherein the RESURF layers 11a, 11b, 11c, and 11d include 1-n RESURF layers 11a, 11b, 11c, and 11d formed from a lower portion of the device in the direction of the height of the device.

The third semiconductor regions 21a, 21b, 21c, and 21d may include 1-n layers formed from the lower portion of the device in the direction of the height of the device.

The first semiconductor region 10 of the power semiconductor device may have the source region 40, the well region 30, and the second drift layer 10b formed on an upper surface thereof.

The first semiconductor region 10 may have a gate 50 formed on the upper surface thereof so as to cover the source region 40, an upper portion of the well region 30, and the second drift layer 10b.

The gate 50 may be formed by forming a gate oxide 51 on the upper surface of the first semiconductor region 10, forming a poly gate 52 on the gate oxide 51, and again covering the poly gate 52 with the gate oxide 51.

A source metal layer 60 may be formed so as to cover an exposed upper surface of the first semiconductor region 10 and the gate 50, and a drain metal layer 70 may be formed on a lower surface of the first semiconductor region 10.

The power semiconductor device according to an exemplary embodiment of the present technology may further include a buffer layer 12 formed between the drain metal layer 70 and the first semiconductor region 10.

In the case in which the buffer layer 12 includes a high-concentration of first conductivity type impurities, it may serve to decrease the thickness of the drift layer in the MOSFET, and in the case in which the buffer layer 12 has second conductivity type impurities, the power semiconductor device may be operated as an IGBT.

In addition, the power semiconductor device according to an exemplary embodiment of the present technology may further include a trench 80 extending through the well region 30 into a portion of the first RESURF layer 11a.

In detail, the trench 80 may extend through the second semiconductor regions 22a, 22b, 22c, and 22d below the well region 30.

The trench 80 may have a shape in which the width of an upper portion thereof is wider than that of a lower portion thereof.

In detail, the trench 80 may have a generally tapered shape.

The trench 80 may be filled with a fill material.

The fill material may be at least one of a second conductivity type material and silicon oxide ($SiO_2$).

In the case in which the fill material is the second conductivity type material, conductivity of the RESURF structure may be significantly increased.

In the case when the fill material is silicon oxide, the breakdown voltage of the power semiconductor device would be increased as the boron used as the p-type impurity is precipitated at the area abutting the trench 80.

The source region 40 may be formed by implanting high-concentration of n-type impurities. Therefore, the well region 30 in which relatively low-concentration p-type impurities are implanted may become a depletion region.

That is, since the well region 30 is the depletion region, in the case when no voltage is applied to the gate 50, the well region 30 may become an insulation region in which a current does not flow.

However, in the case when a positive voltage is applied to the gate 50, electrons may be drawn to a portion of the well region 30 adjacent to a lower portion of the gate 50 to form a channel.

A current may flow from the source metal layer 60 to the drain metal layer 70 through the channel.

The first semiconductor region 10 may have 1 to n RESURF layers 11a, 11b, 11c, and 11d formed therein.

The first drift layer 10a may have 1 to n RESURF layers 11a, 11b, 11c, and 11d formed thereabove.

The RESURF layers 11a, 11b, 11c, and 11d may have a RESURF structure in which the second semiconductor regions 22a, 22b, 22c, and 22d being of the second conductivity type and the third semiconductor regions 21a, 21b, 21c, and 21d being of the first conductivity type are alternately disposed.

Through RESURF layers 11a, 11b, 11c, and 11d, the concentration of first conductivity type impurities of the third semiconductor regions 21a, 21b, 21c, and 21d may be increased as compared with a power semiconductor device according to the prior art.

Therefore, the power semiconductor device according to an exemplary embodiment of the present technology may have a forward voltage drop lower than that of a general device having the same breakdown voltage.

Figure 2:
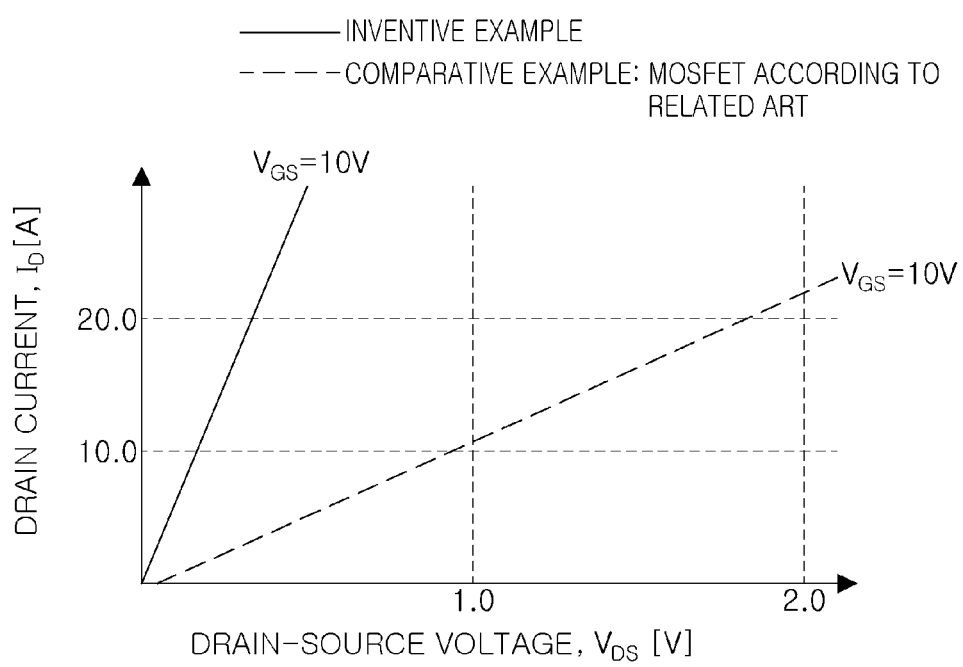
FIG. 2 is a graph illustrating VDS-ID of the power semiconductor device according to an exemplary embodiment of the present technology and a MOSFET according to the prior art.

Referring to FIG. 2 illustrating a relationship between a drain-source voltage $V_{DS}$ and a drain current $I_D$, it may be appreciated that the power semiconductor device according to an exemplary embodiment of the present technology has a low forward voltage drop, such that it has a drain current $I_D$ higher than that of the MOSFET according to the prior art.

FIGS. 3A through 3D are views illustrating extension of the depletion regions in a turned-off state of the power semiconductor device according to an exemplary embodiment of the present technology.

The depletion region is illustrated by a two-dot chain line in FIGS. 3A through 3D.

In the case in which the widths of the upper and lower portions of a semiconductor region of a p-type are the same as each other in the RESURF structure at the time of a turned-off operation of the device, as the source-drain voltage is increased, the depletion region may be extended.

As the positive voltage applied to the drain is increased, the depletion layer formed in the first semiconductor region 10 of an n-type may be gradually extended toward the drain, and the depletion regions formed in the second semiconductor regions 21a, 21b, 21c, and 21d of the p-type may be gradually extended toward the source.

In the case of the device of the prior art having a RESURF structure, since the widths of the upper and lower portions of the semiconductor region of the p-type are the same, as the source-drain voltage is increased, the depletion regions are similarly extended into an upper semiconductor region of p-type and a lower semiconductor region of p-type.

That is, the difference between a source-drain voltage at which the lower semiconductor region of the p-type is entirely depleted and a source-drain voltage at which the upper semiconductor region of the p-type is entirely depleted may be small.

When the upper semiconductor region of the p-type is entirely depleted, the depletion region may be extended into the well region of the p-type.

However, since the well region of the p-type is formed by implanting a relatively very high-concentration of impurities in order to implement $V_{th}$ characteristics, a punch-through, breakdown phenomenon may occur due to invasion of the depletion region into the well region.

However, referring to FIGS. 3A through 3D, in a power semiconductor device according to an exemplary embodiment of the present technology, the widest width of the second semiconductor regions 22a, 22b, 22c, and 22d formed in the first to $n^{th}$ RESURF layers 11a, 11b, 11c, and 11d, is $P_n$, $P_1 < P_n$. Alternatively, the narrowest width of the third semiconductor regions 21a, 21b, 21c, and 21d formed in the first to $n^{th}$ RESURF layers, is $Q_n$, $Q_1 > Q_n$. Therefore, even though the source-drain voltage is increased, the second semiconductor region 22d of the $n^{th}$ RESURF layer 11d may provide enough of a region to extend the depletion region.

In detail, in the power semiconductor device according to an exemplary embodiment of the present technology, the widest width of the second semiconductor region 22a, 22b, 22c, or 22d of the $n^{th}$ layer is $P_n$, $P_{n-1} < P_n$ (n≥2), and the narrowest width of the third semiconductor region 21a, 21b, 21c, or 21d of the $n^{th}$ layer is $Q_n$, $Q_{n-1} > Q_n$ (n≥2).

Here, $P_1$ means the widest width of the second semiconductor region 22a of the first layer, and $P_n$ means the widest width of the second semiconductor region 22d of the $n^{th}$ layer.

In addition, $Q_1$ means the narrowest width of the third semiconductor region 21a of the first layer, and $Q_n$ means the narrowest width of the third semiconductor region 21d of the $n^{th}$ layer.

In the power semiconductor device according to an exemplary embodiment of the present technology, since the above Equation $P_1 < P_n$ (n≥2) or $Q_1 > Q_n$ (n≥2) is satisfied, as described above, the region is large enough to extend the depletion region, such that the breakdown voltage may be significantly improved as compared with the prior art.

Extension shapes of the depletion regions depending on an increase in the source-drain voltage will be described with reference to FIGS. 3A through 3D.

Figure 3A:
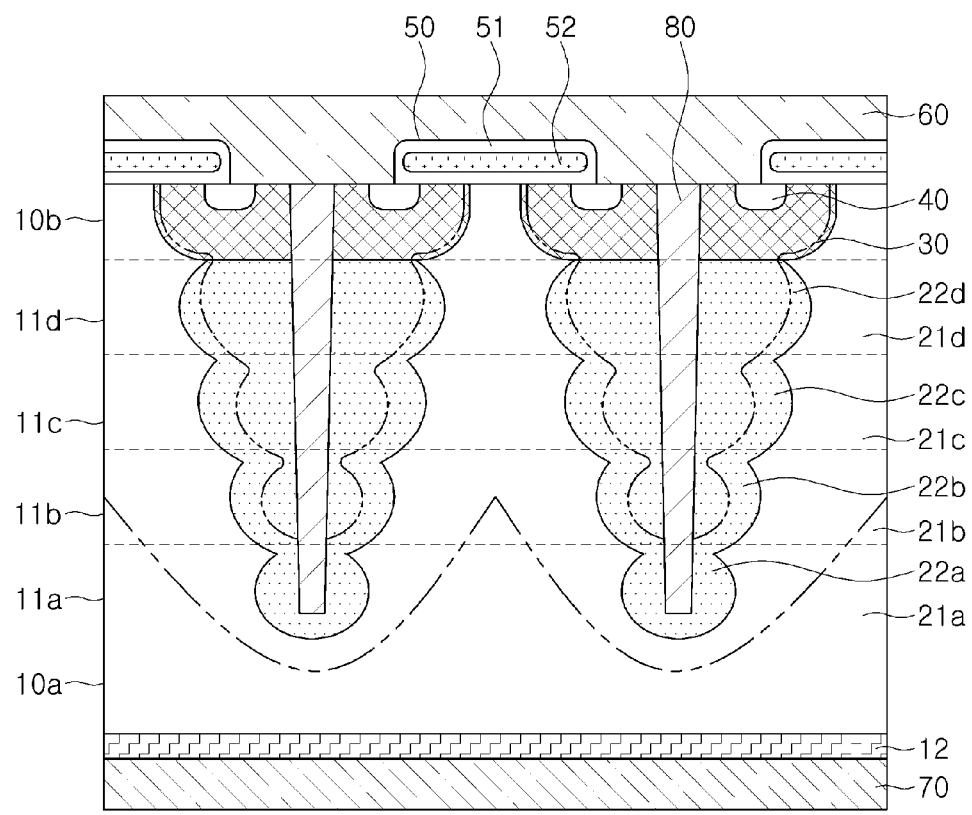
FIGS. 3A through 3D are views illustrating extension of depletion regions in a turned-off state of the power semiconductor device according to an exemplary embodiment of the present technology.

FIG. 3A is a cross-sectional view schematically illustrating the shape of depletion regions in the case in which a source-drain voltage is not applied.

In the case in which a source-drain voltage is not applied, electrons of the third semiconductor regions 21a, 21b, 21c, and 21d and holes of the second semiconductor regions 22a, 22b, 22c, and 22d may be combined with each other, such that the depletion regions are formed in the vicinity of boundary lines on which the third semiconductor regions 21a, 21b, 21c, and 21d and the second semiconductor regions 22a, 22b, 22c, and 22d abut each other.

In detail, the boundaries of the depletion regions formed in the first drift layer 10a and the third semiconductor regions 21a, 21b, 21c, and 21d may be affected by shapes of the second semiconductor regions 22a, 22b, 22c, and 22d positioned in the first to $n^{th}$ layers.

Boundaries of the depletion regions formed in the second semiconductor regions 22a, 22b, 22c, and 22d may have the same shapes as those of boundaries at which the third semiconductor regions 21a, 21b, 21c, and 21d and the second semiconductor regions 22a, 22b, 22c, and 22d abut each other and may be formed inside the second semiconductor regions 22a, 22b, 22c, and 22d.

The depletion regions are affected by the shapes of the second semiconductor regions 22a, 22b, 22c, and 22d. In the case in which the length of the longest gap, in the direction of the width of the device of the depletion region formed in the second semiconductor region of the $n^{th}$ layer is $R_n$, the following Equation: $R_1 < R_n$ (n≥2) may be satisfied.

Figure 3B:
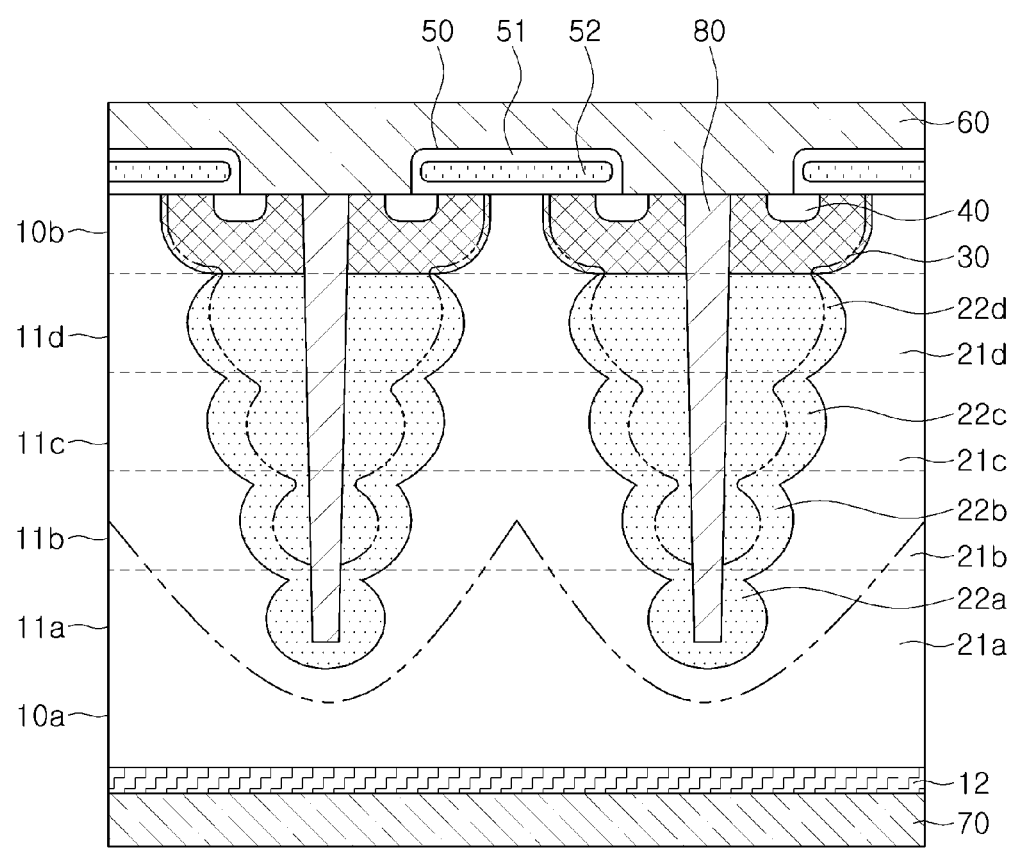

FIG. 3B is a cross-sectional view schematically illustrating the shape of depletion regions in the case in which a low source-drain voltage is applied.

In the case in which the source-drain voltage is applied, electrons may be drawn toward the drain metal layer 70 to which a positive voltage is applied, and holes may be drawn toward the source metal layer 60 to which a negative voltage is applied.

In detail, boundaries of the depletion regions formed in the third semiconductor regions 21a, 21b, 21c, and 21d and the first drift layer 10a may be drawn toward the drain metal layer 70, and boundaries of the depletion regions formed in the second semiconductor regions 22a, 22b, 22c, and 22d may be drawn toward the source metal layer 60.

As a result, the entire second semiconductor region 22a of the first RESURF layer 11a may become the depletion region, and boundaries of the depletion regions may be present in the second semiconductor regions 22b, 22c, and 22d of the second to $n^{th}$ RESURF layers 11b, 11c, and 11d.

Figure 3C:
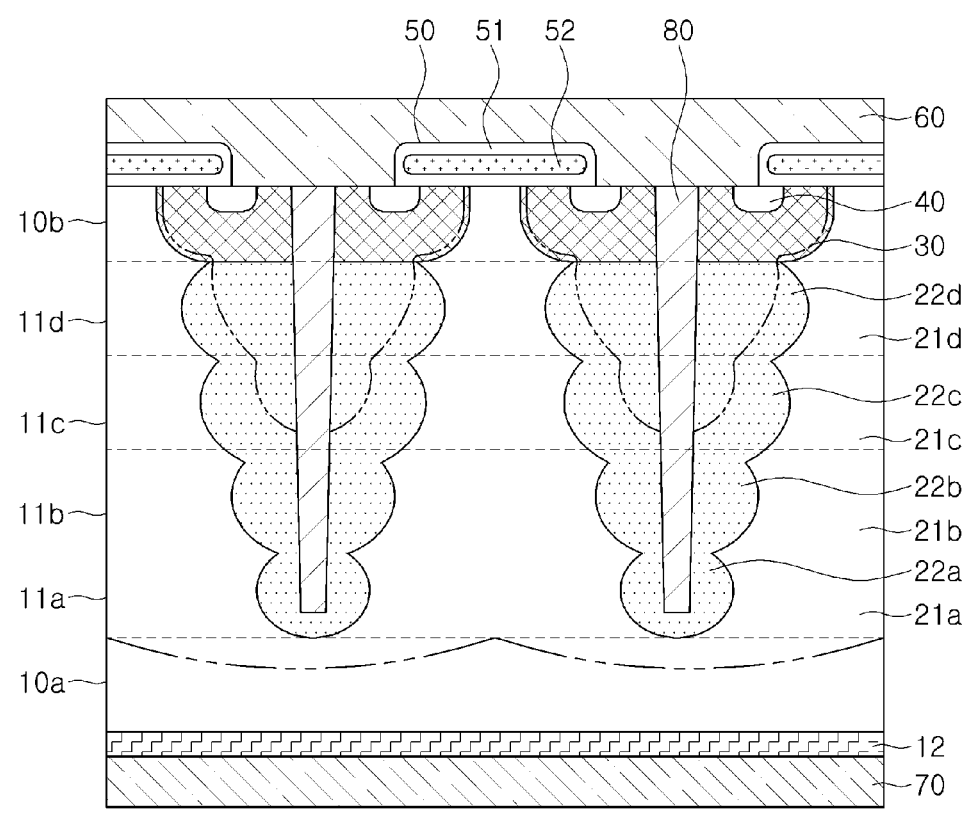

FIG. 3C is a cross-sectional view schematically illustrating the shape of depletion regions in the case in which a source-drain voltage higher than the source-drain voltage of FIG. 3B is applied.

In the case in which the source-drain voltage higher than the source-drain voltage of FIG. 3B is applied, the boundary of the depletion region formed in the first drift layer 10a may be further drawn toward the drain metal layer 70, and the boundaries of the depletion regions formed in the second semiconductor regions 22b, 22c, and 22d of the second to $n^{th}$ layers may be further drawn toward the source metal layer 60.

The entire second semiconductor region 22b of the second RESURF layer 11b may also become the depletion region, and the boundaries of the depletion regions may be present in the second semiconductor regions 22c and 22d of the $(n-1)^{th}$ and $n^{th}$ RESURF layers 11c and 11d.

Figure 3D:
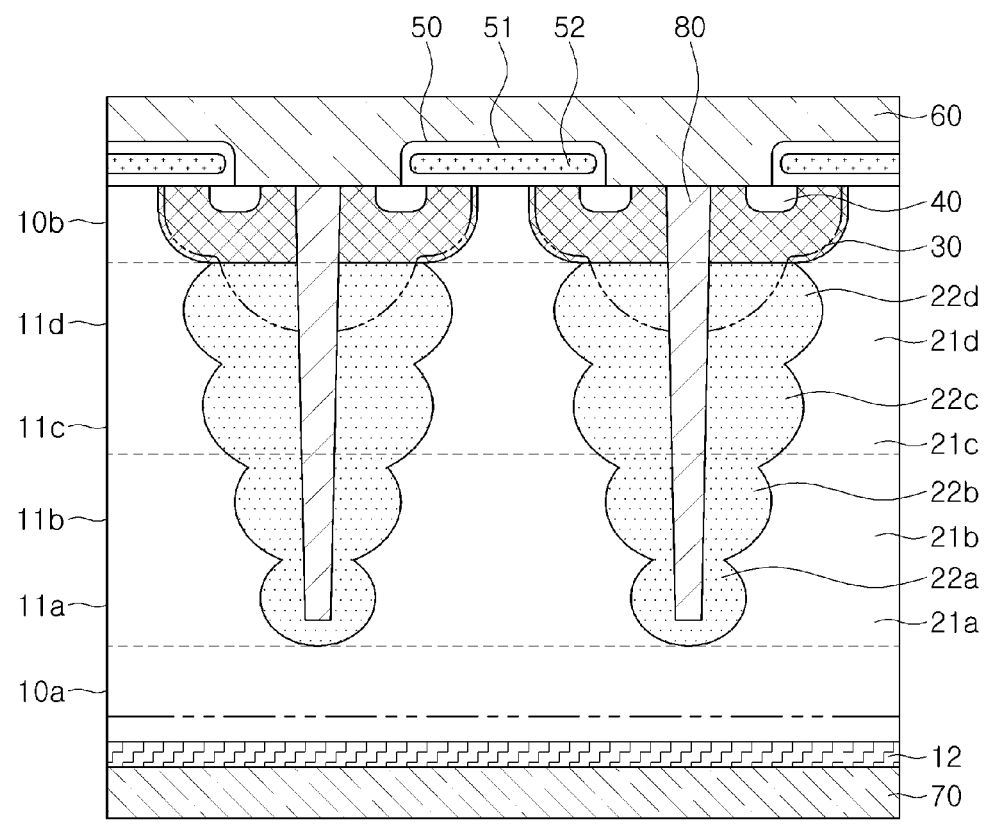

FIG. 3D is a cross-sectional view schematically illustrating the shape of depletion regions in the case in which a high source-drain voltage is applied.

In the case in which the high source-drain voltage is applied, the boundary of the depletion region formed in the first drift layer 10a may be further drawn toward the drain, and the boundaries of the depletion regions formed in the second semiconductor regions 22c and 22d of the $(n-1)^{th}$ and $n^{th}$ layers may be further drawn toward the source metal layer 60.

In the case in which a very high source-drain voltage is applied, all of the first to $(n-1)^{th}$ RESURF layers 11a, 11b, and 11c may become the depletion region.

However, as seen from FIG. 3D, a portion that is not the depletion region may remain in the second semiconductor region 22d of the $n^{th}$ RESURF layer 11d even at a very high voltage.

Therefore, in the power semiconductor device according to an exemplary embodiment of the present technology, since the extension of the depletion region to the well region may be prevented even at a very high voltage, the punch-through, breakdown phenomenon due to the invasion of the depletion region into the well region may be prevented, such that the breakdown voltage may be increased.

In detail, in order to significantly increase this effect, the following Equation: $P_{n-1} \leq P_n$ (n≥2) or $Q_{n-1} > Q_n$ (n≥2) may be satisfied in the power semiconductor device according to an exemplary embodiment of the present technology.

In addition, in order to significantly increase this effect, the following Equation: $R_{n-1} \leq R_n$ may also be satisfied in the power semiconductor device according to an exemplary embodiment of the present technology.

Figure 4:
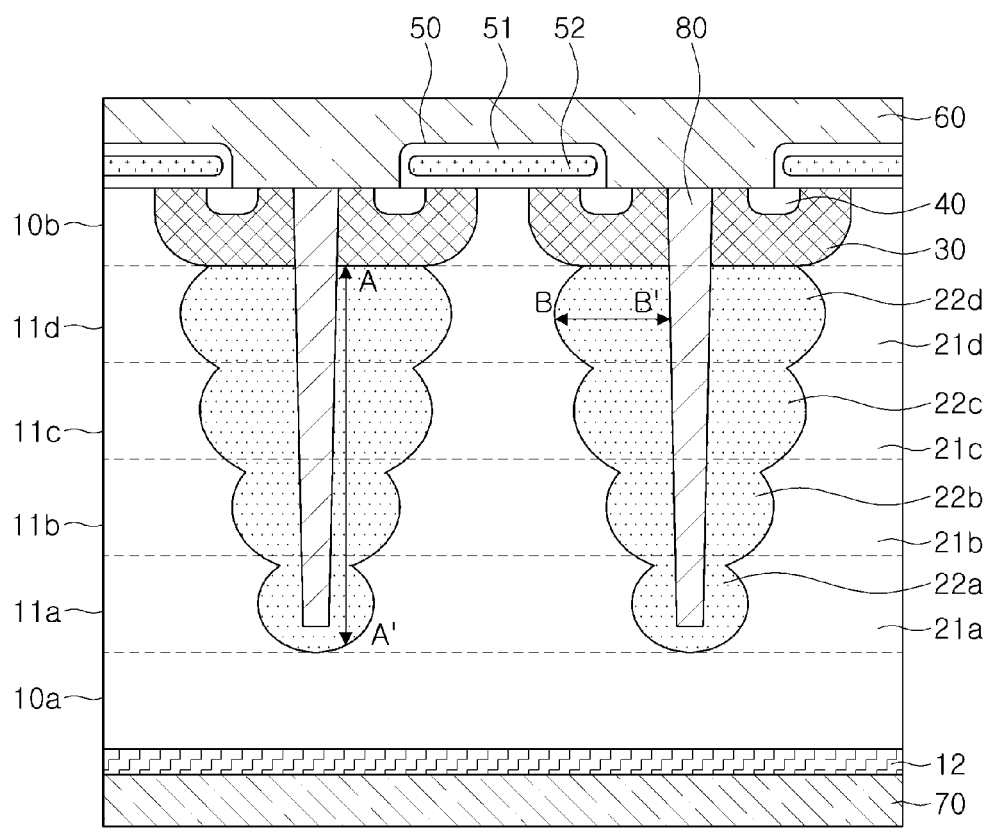
FIG. 4 is a schematic cross-sectional view of the power semiconductor device according to an exemplary embodiment of the present technology.
Figure 5A:
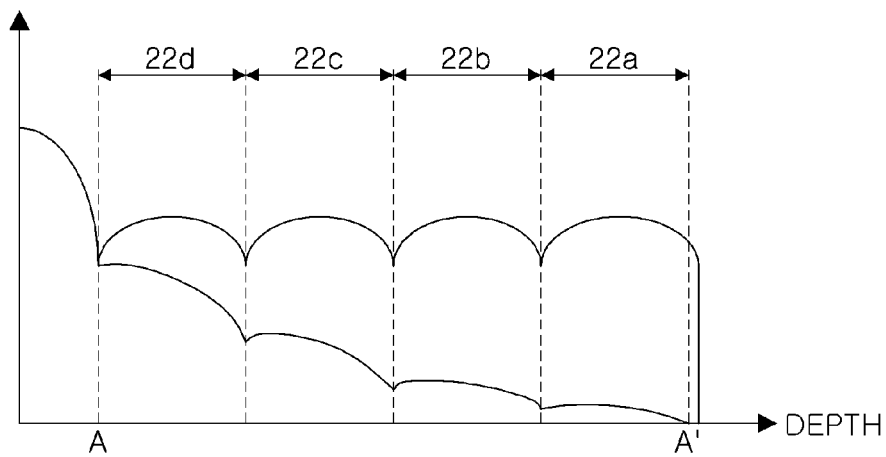
FIGS. 5A and 5B are views illustrating concentrations of second conductivity type impurities along lines A-A' and B-B' of FIG. 4, respectively.
Figure 5B:
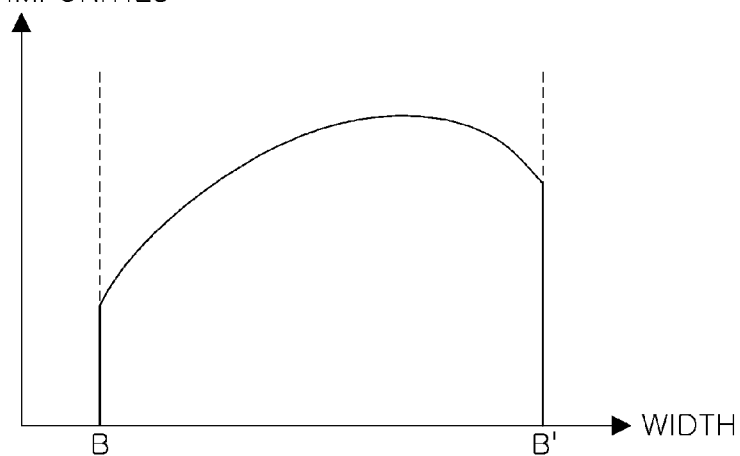

FIG. 4 is a schematic cross-sectional view of the power semiconductor device according to an exemplary embodiment of the present technology; and FIGS. 5A and 5B are views illustrating concentrations of second conductivity type impurities along lines A-A' and B-B' of FIG. 4, respectively.

FIG. 5A shows concentrations of p-type impurities depending on depths, in the direction of height of the device, of the second semiconductor regions 22a, 22b, 22c, and 22d of the first to $n^{th}$ RESURF layers 11a, 11b, 11c, and 11d along line A-A' of FIG. 4. Line A-A' extends along the direction of height of the device while Line B-B' extends along the direction of width of the device.

As illustrated in FIG. 5A, the concentrations of p-type impurities of the second semiconductor regions 22a, 22b, 22c, and 22d of the first to $n^{th}$ RESURF layers 11a, 11b, 11c, and 11d may be constant.

Since the concentrations of the p-type impurities are constant, the depletion regions formed in the second semiconductor regions 22a, 22b, 22c, and 22d may be spaced apart from boundaries between the second semiconductor regions 22a, 22b, 22c, and 22d and the third semiconductor regions 21a, 21b, 21c, and 21d by the same distance in a state in which the voltage is not applied.

However, the present technology is not limited thereto. For example, as illustrated by the dotted lines in FIG. 5A, in the case that the concentration of impurities at a portion at which the concentration of second conductivity type impurities is the highest in the direction of height of the device in the second semiconductor region of the $n^{th}$ layer is $D_n$, the concentrations may be controlled so as to satisfy the following Equation: $D_1 < D_n$.

In the case in which the above Equation: $D_1 < D_n$ is satisfied, the distance between the boundary of the depletion region of the $n^{th}$ RESURF layer 11d having a high concentration and the boundary of the second semiconductor region 21d may be shorter than a distance between a boundary of the depletion region of the first RESURF layer 11a and the boundary of the second semiconductor region 21a.

That is, since the non-depletion region of the $n^{th}$ RESURF layer 11d is wider than that of the first RESURF layer 11a, as the source-drain voltage is increased, the region to which the depletion region is to be extended may be controlled such that the breakdown voltage may be increased.

Therefore, the widths P of the second semiconductor regions 22a, 22b, 22c, and 22d, the widths Q of the third semiconductor regions 21a, 21b, 21c, and 21d, and the concentrations D of the second semiconductor regions 22a, 22b, 22c, and 22d may be combined with one another to control the regions to which the depletion regions can be extended, thereby increasing the breakdown voltage.

FIG. 5B shows a concentration of p-type impurities, in the direction of width of the device, of the second semiconductor region 22d, from a boundary B of the second semiconductor region 22d of the $n^{th}$ layer formed in the $n^{th}$ RESURF layer 11d to the trench B'.

Although only the concentration of the p-type impurities, in the direction of width of the device, of the second semiconductor region 22d of the $n^{th}$ layer has been illustrated in FIG. 5B, it has been confirmed that the second semiconductor regions 22a, 22b, and 22c of the first to $(n-1)^{th}$ layers also have the same form as that of FIG. 5B.

In order for the second semiconductor regions 22a, 22b, 22c, and 22d according to an exemplary embodiment of the present technology to have a p-type conductivity type, boron may be implanted as an impurity into the second semiconductor regions 22a, 22b, 22c, and 22d.

In the case in which the trench 80 of the power semiconductor device according to an exemplary embodiment of the present technology is filled with silicon oxide ($SiO_2$), boron may be precipitated on the surface of the silicon oxide due to contact between the silicon oxide and the boron.

Therefore, as illustrated in FIG. 5B, the concentration of p-type impurities at a portion of the second semiconductor region 22d abutting trench 80 may be decreased due to the precipitation of the boron.

In the device having the RESURF structure according to the prior art, the p-type impurities are injected and are then subjected to heat treatment to complete the RESURF structure.

In the case in which the concentration of the central portion of the p-type semiconductor region is high due to the implantation of p-type impurities, this portion blocks extension of the depletion region in the situation in which a high breakdown voltage is required.

That is, the central portions of the second semiconductor regions 22a, 22b, 22c, and 22d become high-concentration impurities regions due to the implantation of p-type impurities, such that the extension of the depletion region is blocked and an electric field is concentrated on these portions.

In the case of diffusing the p-type impurities through heat treatment in order to solve these problems, the width of the n-type semiconductor region through which electrons are to pass is decreased, such that the forward voltage drop is increased.

However, in the power semiconductor device according to an exemplary embodiment of the present technology, the concentration of the impurities at a central portion is low due to the fact that boron is precipitated, such that the extension of the depletion region is blocked and the problem that the electric field is concentrated as described above may be prevented.

In addition, the p-type impurities do not need to be excessively diffused, such that the forward voltage drop may be maintained at a low level.

Therefore, the power semiconductor device according to an exemplary embodiment of the present technology may maintain a forward voltage drop at a low level and may have a high breakdown voltage.

Figure 6:
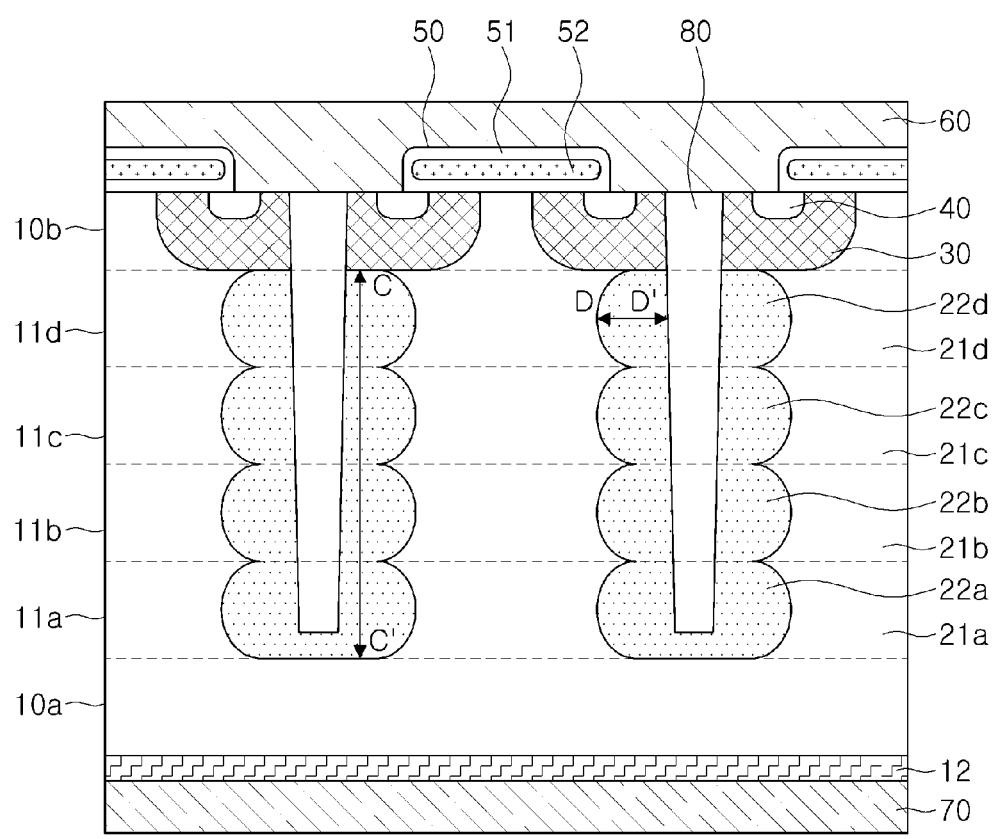
FIG. 6 is a schematic cross-sectional view of a power semiconductor device according to another exemplary embodiment of the present technology.
Figure 7A:
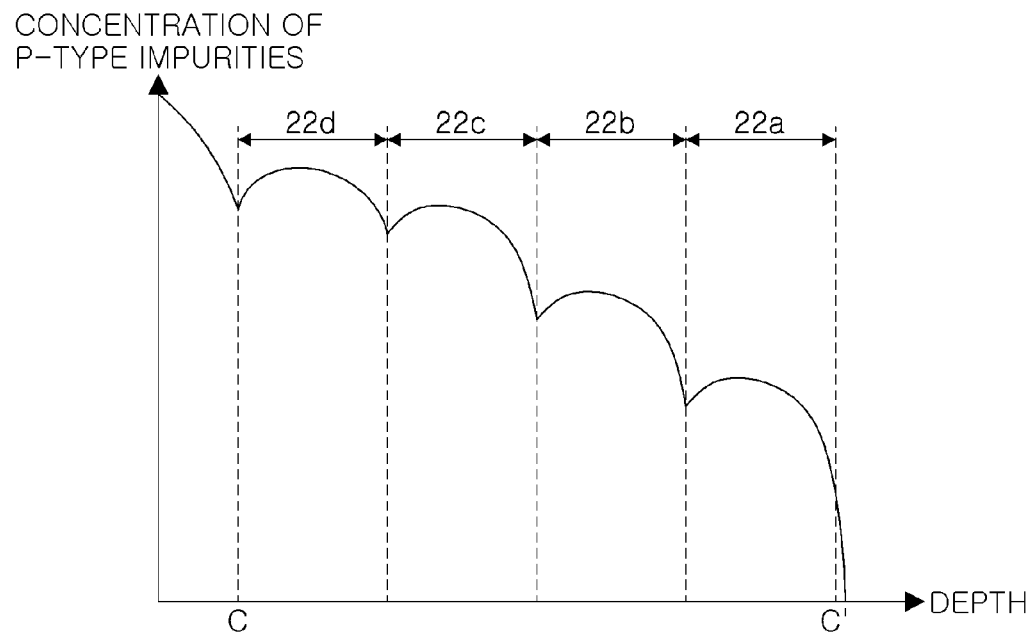
FIGS. 7A and 7B are views illustrating concentrations of second conductivity type impurities along lines C-C' and D-D' of FIG. 6, respectively.
Figure 7B:
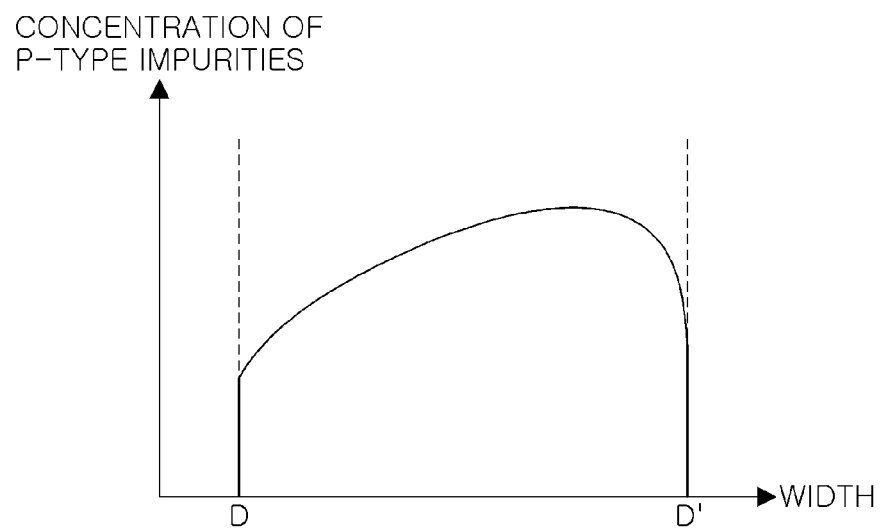

FIG. 6 is a schematic cross-sectional view of a power semiconductor device according to another exemplary embodiment of the present technology; and FIGS. 7A and 7B are views illustrating concentrations of second conductivity type impurities along line C-C' and line D-D' of FIG. 6, respectively. Line C-C' extends along the height of the device. Line D-D' extends along the width of the device.

Referring to FIG. 6, the power semiconductor device according to another exemplary embodiment of the present technology may include a first semiconductor region 10 being of a first conductivity type; second semiconductor regions 22a, 22b, 22c, and 22d formed in the first semiconductor region 10 and being of a second conductivity type; a well region 30 formed above the second semiconductor regions 22a, 22b, 22c, and 22d and being of the second conductivity type; and a source region 40 formed in the well region 30 and being of the first conductivity type, wherein the second semiconductor regions 22a, 22b, 22c, and 22d include 1 to n layers formed from a lower portion of the device measured along its direction of height.

Referring to FIG. 7A, a concentration of p-type impurities of the second semiconductor regions 22a, 22b, 22c, and 22d may be gradually decreased from an upper portion of the second semiconductor regions 22a, 22b, 22c, and 22d toward a lower portion (C-C') thereof in the direction of height of the device.

The concentration of impurities at a portion at which the concentration of second conductivity type impurities is the highest in the direction of height of the device in the second semiconductor region of the $n^{th}$ layer is $D_n$, $D_1 < D_n$ ($n \geq 2$).

In detail, the concentration of the impurities in the portion in which the concentration of the second conductivity type impurities is the highest in the direction of height of the device in the second semiconductor region of the $n^{th}$ layer is $D_n$, $D_{n-1} < D_n$ ($n \geq 2$).

Since the concentration of p-type impurities of the $n^{th}$ RESURF layer is higher than that of the p-type impurities of the $(n-1)^{th}$ RESURF layer, the distance between the boundary of the depletion region formed in the $n^{th}$ RESURF layer and the boundary of the second semiconductor region may be shorter than a distance between a boundary of the depletion region formed in the $(n-1)^{th}$ RESURF layer and the boundary of the second semiconductor region, in a state in which the source-drain voltage is not applied.

FIG. 7B shows the concentration of p-type impurities, in the direction of width of the device, of the second semiconductor region 22d, from a boundary D of the second semiconductor region 22d of the $n^{th}$ RESURF layer 11d to the trench D'.

In order for the second semiconductor regions 22a, 22b, 22c, and 22d according to an exemplary embodiment of the present technology to have a p-type conductivity type, boron may be implanted as an impurity into the second semiconductor regions 22a, 22b, 22c, and 22d.

In the case in which the trench 80 of the power semiconductor device according to an exemplary embodiment of the present technology is filled with silicon oxide ($SiO_2$), boron may be precipitated on the surface of the silicon oxide due to contact between the silicon oxide and the boron.

Therefore, as illustrated in FIG. 7B, the concentration of the p-type impurities at portions of the second semiconductor regions 22a, 22b, 22c, and 22d abutting the trench may be decreased due to the precipitation of the boron.

In the device having the RESURF structure according to the prior art, the p-type impurities are injected and are then subjected to heat treatment to complete the RESURF structure.

In the case in which the concentration of the central portion of the p-type semiconductor region is high due to implantation of p-type impurities, this portion blocks extension of the depletion region in a situation in which a high breakdown voltage is required.

That is, the central portions of the second semiconductor regions 22a, 22b, 22c, and 22d become high-concentration impurities regions due to the implantation of p-type impurities, such that the extension of the depletion region is blocked and an electric field is concentrated on these portions.

In the case of diffusing p-type impurities through heat treatment in order to solve these problems, the width of the n-type semiconductor region through which electrons are to pass is decreased, such that the forward voltage drop is increased.

However, in the power semiconductor device according to an exemplary embodiment of the present technology, the concentration of impurities at the central portion is low due to the fact that boron is precipitated, such that extension of the depletion region is blocked and the problem that the electric field is concentrated as described above may be prevented.

In addition, the p-type impurities do not need to be excessively diffused, such that a forward voltage drop may be maintained at a low level.

Therefore, the power semiconductor device according to an exemplary embodiment of the present technology may maintain a forward voltage drop at a low level and may have a high breakdown voltage.

FIGS. 8A through 8D are views illustrating extension of depletion regions in a turned-off state of power semiconductor device according to another exemplary embodiment of the present technology.

Figure 8A:
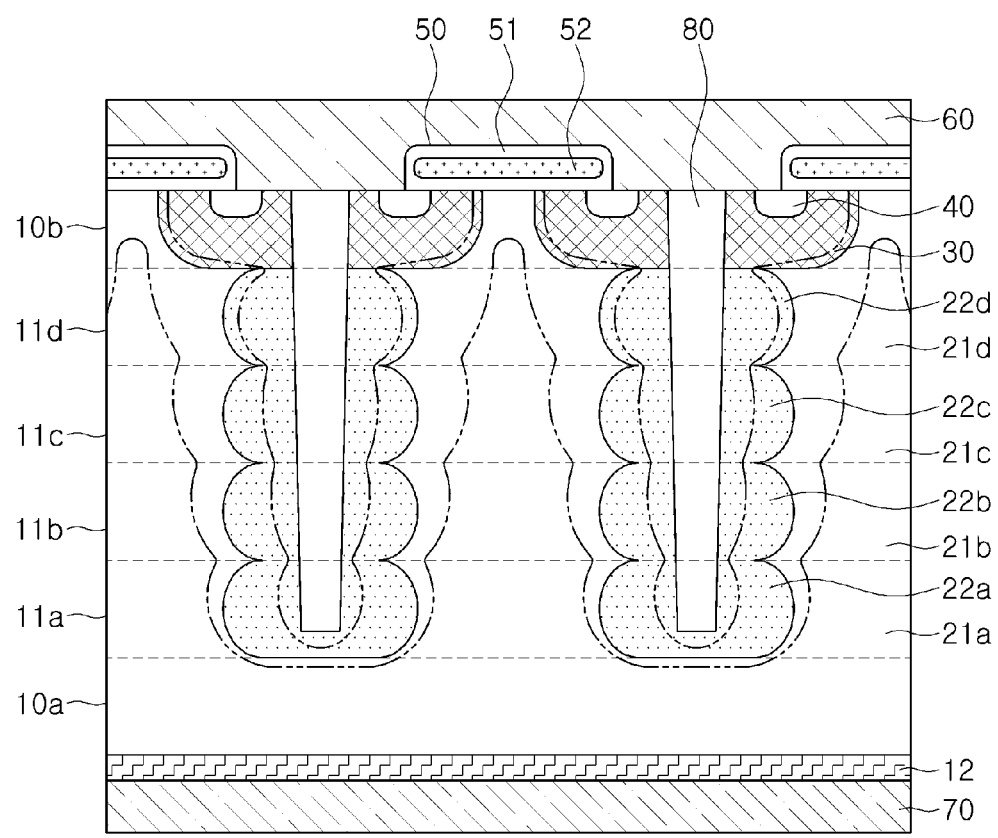
FIGS. 8A through 8D are views illustrating extension of depletion regions in a turned-off state of a power semiconductor device according to another exemplary embodiment of the present technology.

Referring to FIG. 8A, the widths of the second semiconductor regions 22a, 22b, 22c, and 22d of the first to $n^{th}$ layers may be constant. However, the depletion regions may be differently extended in the second semiconductor regions 22a, 22b, 22c, and 22d due to a difference between the concentrations of the second conductivity type impurities of the second semiconductor regions 22a, 22b, 22c, and 22d, as illustrated in FIG. 7A.

That is, since the concentration of the second conductivity type impurities of the second semiconductor region 22d of the $n^{th}$ layer is higher than that of the second conductivity type impurities of the second semiconductor region 22a of the first layer, the distance between the boundary of the depletion region formed in the second semiconductor region 22d of the $n^{th}$ layer and the boundary of the second semiconductor region may be shorter than the distance between the boundary of the depletion region formed in the second semiconductor region 22a of the first layer and the boundary of the second semiconductor region, in the state in which the source-drain voltage is not applied.

Figure 8B:
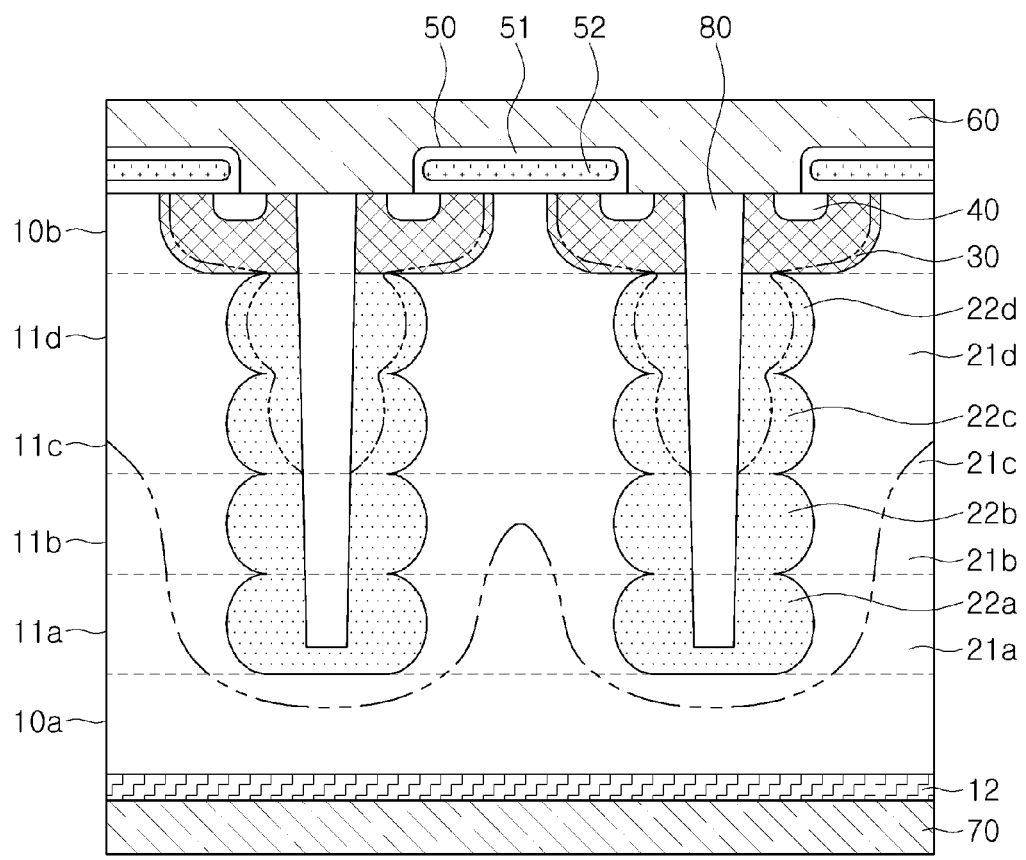

FIG. 8B is a cross-sectional view schematically illustrating the shape of depletion regions in the case in which a low source-drain voltage is applied.

In the case in which the low source-drain voltage is applied, electrons may be drawn toward the drain metal layer 70 to which a positive voltage is applied, and holes may be drawn toward the source metal layer 60 to which a negative voltage is applied.

Therefore, the boundaries of the depletion regions formed in the third semiconductor regions 21a, 21b, 21c, and 21d of the first to $n^{th}$ layers and the first drift layer 10a may be drawn toward the drain metal layer 70, and boundaries of the depletion regions formed in the second semiconductor regions 22a, 22b, 22c, and 22d may be drawn toward the source metal layer 60.

The entire second semiconductor region 22a of the first RESURF layer 11a may become the depletion region, and the boundaries of the depletion regions may be present in the second semiconductor regions 22b, 22c, and 22d of the second to $n^{th}$ layers.

Figure 8C:
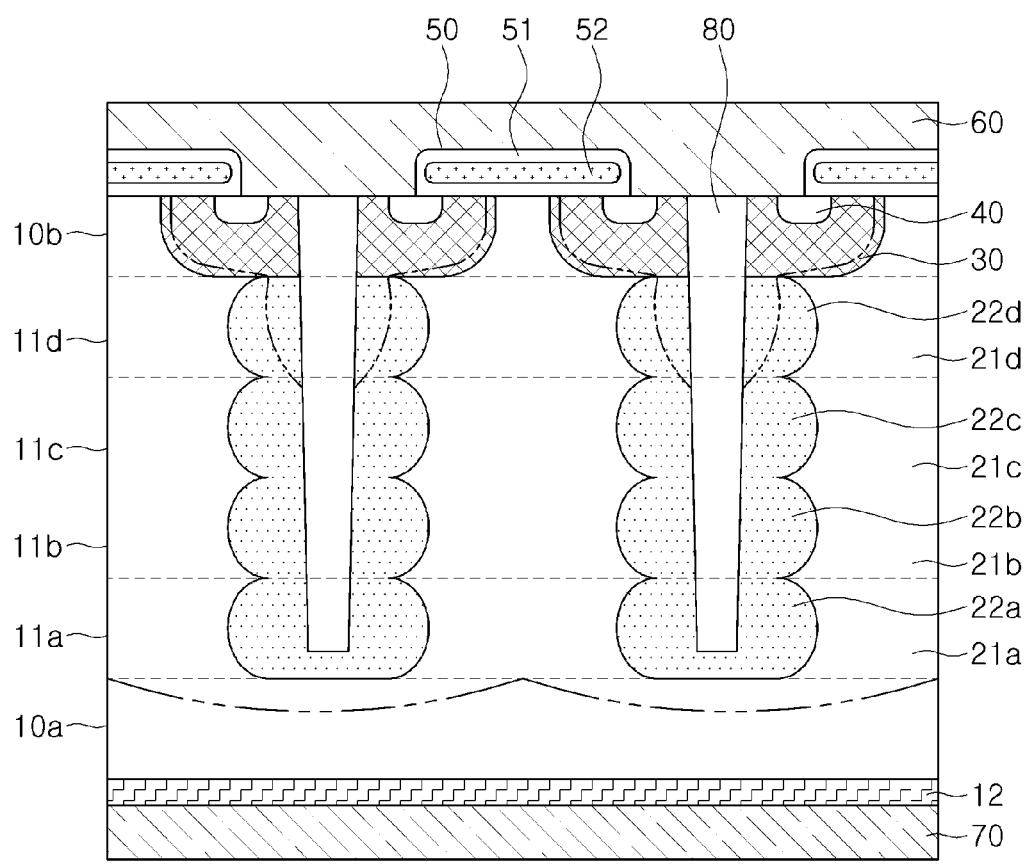

FIG. 8C is a cross-sectional view schematically illustrating the shape of the depletion regions in the case in which a source-drain voltage higher than the source-drain voltage of FIG. 8B is applied.

In the case in which the source-drain voltage higher than the source-drain voltage of FIG. 8B is applied, the boundary of the depletion region formed in the first drift layer 10a may be further drawn toward the drain metal layer 70, and the boundaries of the depletion regions formed in the second semiconductor regions 22b, 22c, and 22d may be further drawn toward the source metal layer 60.

The entire second semiconductor region 22b of the second layer may also become the depletion region, and the boundaries of the depletion regions may be present in the second semiconductor regions 22c and 22d of the $(n-1)^{th}$ and $n^{th}$ layers.

Figure 8D:
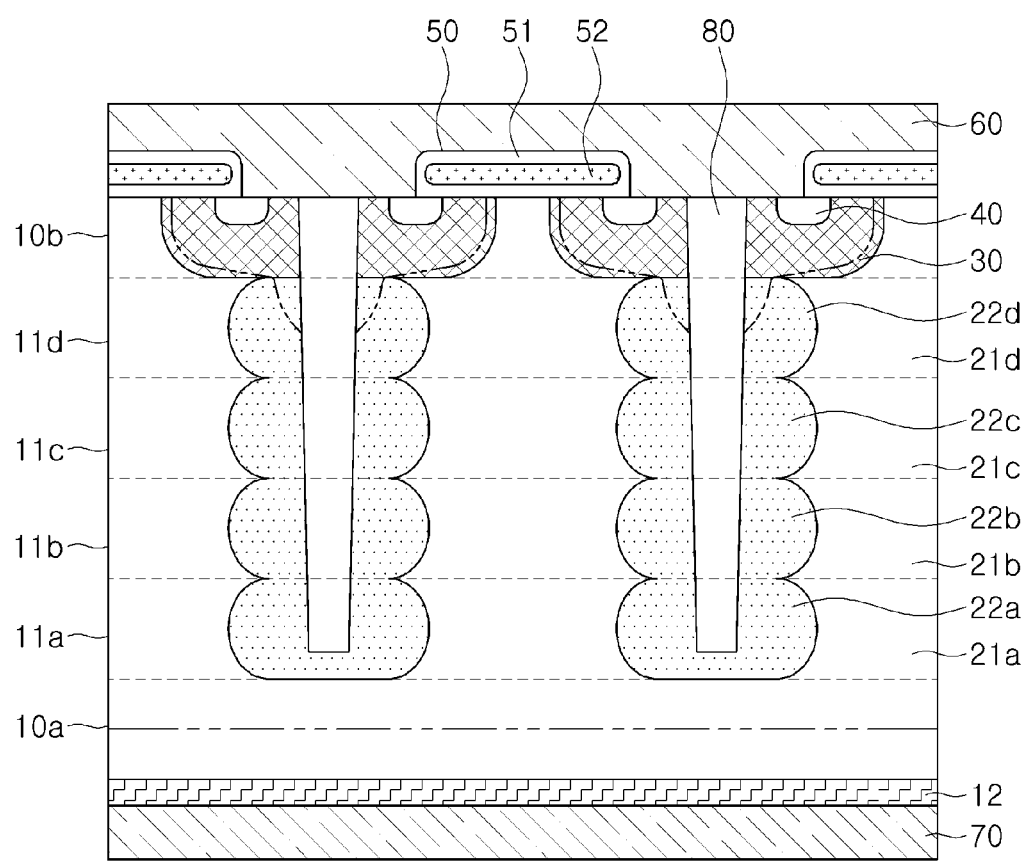

FIG. 8D is a cross-sectional view schematically illustrating the shape of depletion regions in the case in which a high source-drain voltage is applied.

In the case in which a high source-drain voltage is applied, the boundary of the depletion region formed in the first drift layer 10a may be further drawn toward the drain metal layer 70, and the boundaries of the depletion regions formed in the second semiconductor regions 22c and 22d of the (n−1)$^{th}$ and n$^{th}$ layers may be further drawn toward the source metal layer 60.

In the case in which a very high source-drain voltage is applied, all of the first to (n−1)$^{th}$ RESURF layers 11a, 11b, and 11c may become the depletion region.

However, as seen from FIG. 8D, a portion that is not the depletion region may remain in the second semiconductor region 22d of the n$^{th}$ RESURF layer 11d even at the very high voltage.

Therefore, in the power semiconductor device according to another exemplary embodiment of the present technology, since the extension of the depletion region to the well region 30 may be prevented even at a very high voltage, the punch-through breakdown phenomenon due to the invasion of the depletion region into the well region may be prevented, while the breakdown voltage may be increased.

FIGS. 9A through 9H are views schematically illustrating a method of manufacturing a power semiconductor device according to an exemplary embodiment of the present technology.

A method of manufacturing a power semiconductor device according to an exemplary embodiment of the present technology will be described with reference to FIG. 9. The method of manufacturing a power semiconductor device according to an exemplary embodiment of the present technology may include: preparing a first semiconductor region 10 having a first conductivity type (See FIG. 9A); forming a second semiconductor region 22d of the n$^{th}$ layer by etching portions of the first semiconductor region 10 and implanting second conductivity type impurities 22d' (See FIGS. 9B and 9C); forming a second semiconductor region 22c of the (n−1)$^{th}$ layer by etching portions of the first semiconductor region 10 from the second semiconductor region 22d of the n$^{th}$ layer and implanting second conductivity type impurities 22c' (See FIGS. 9C and 9D); adding a fill material in the etched portions (See FIG. 9F); forming a well region 30 over the second semiconductor regions 22a, 22b, 22c, and 22d by implanting second conductivity type impurities (See FIG. 9F); and forming a source region 40 in the well region 30 by implanting the first conductivity type impurities (See FIG. 9F).

Figure 9A:
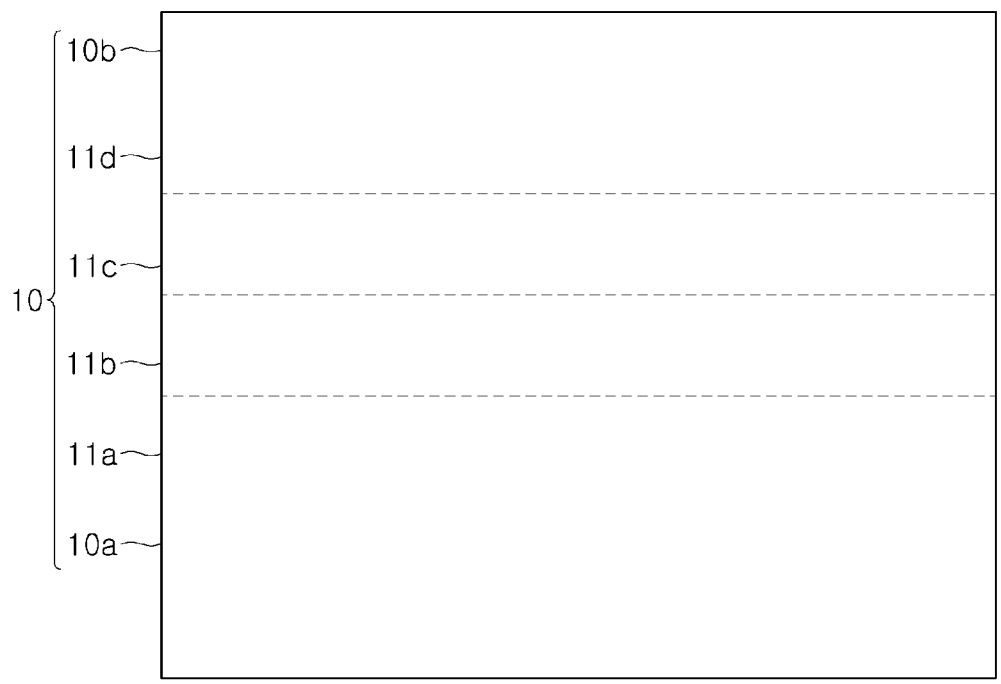
FIGS. 9A through 9H are views schematically illustrating a method of manufacturing a power semiconductor device according to an exemplary embodiment of the present technology.
Figure 9B:
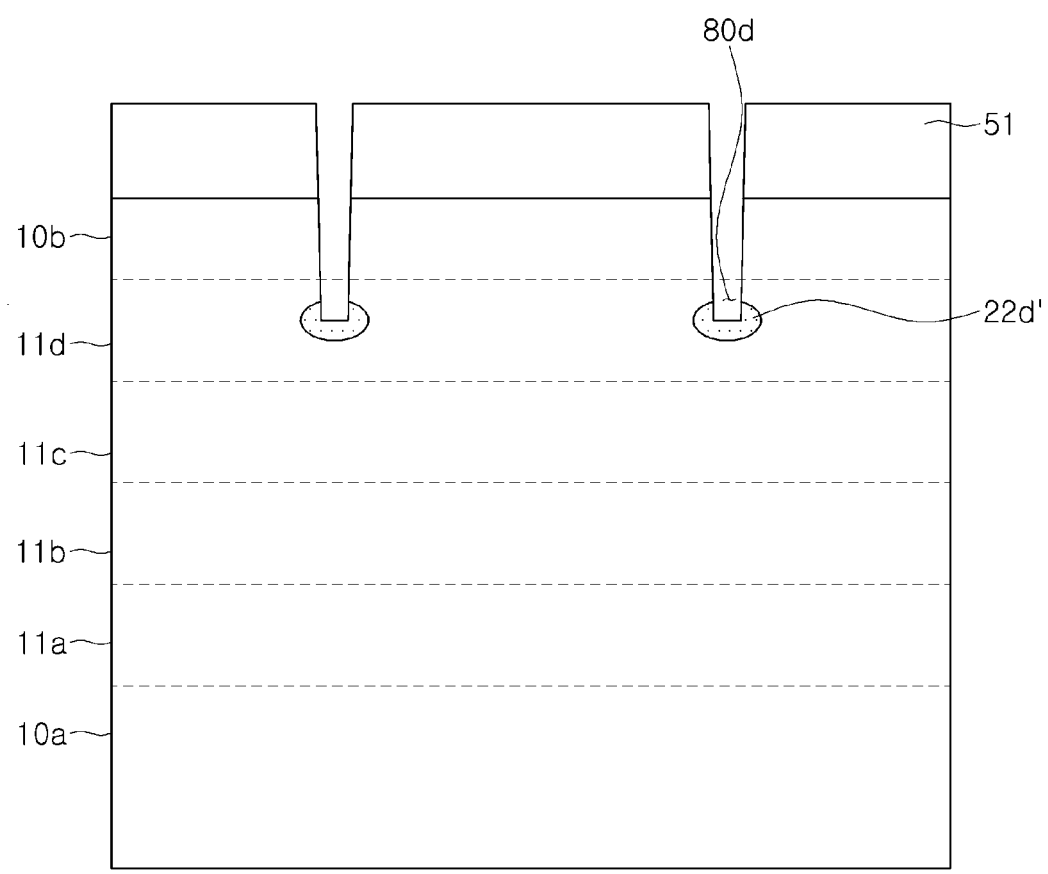
Figure 9C:
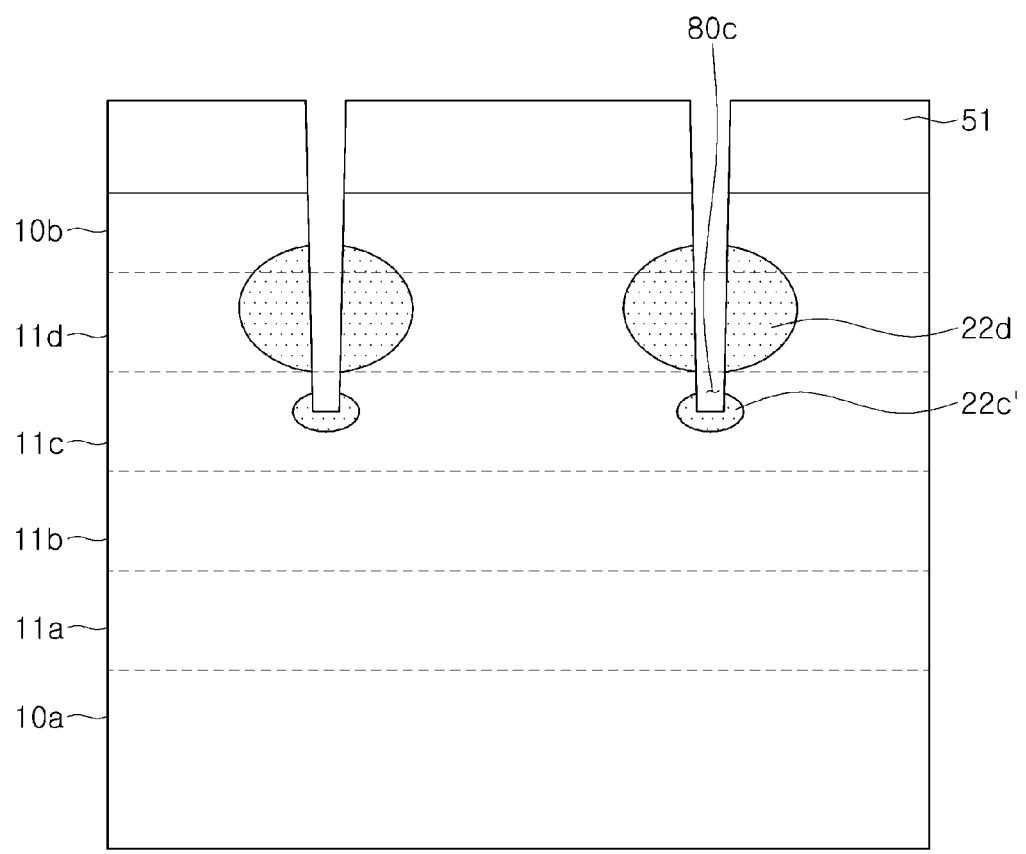
Figure 9D:
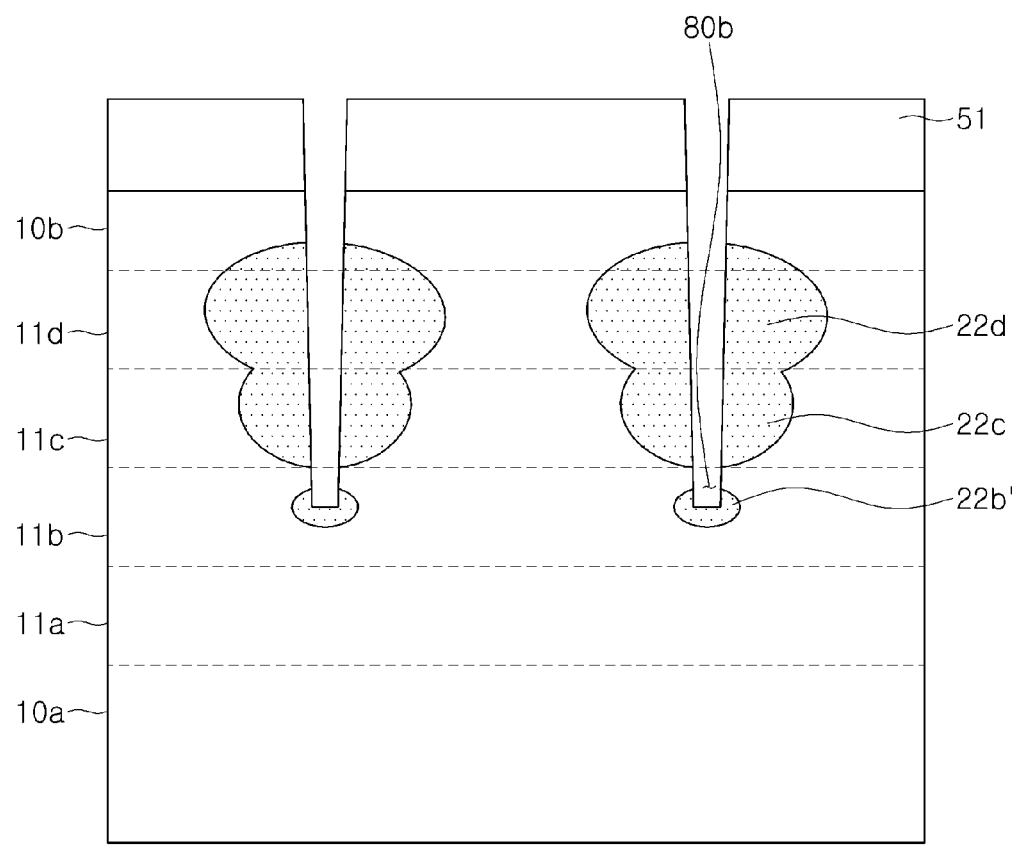
Figure 9E:
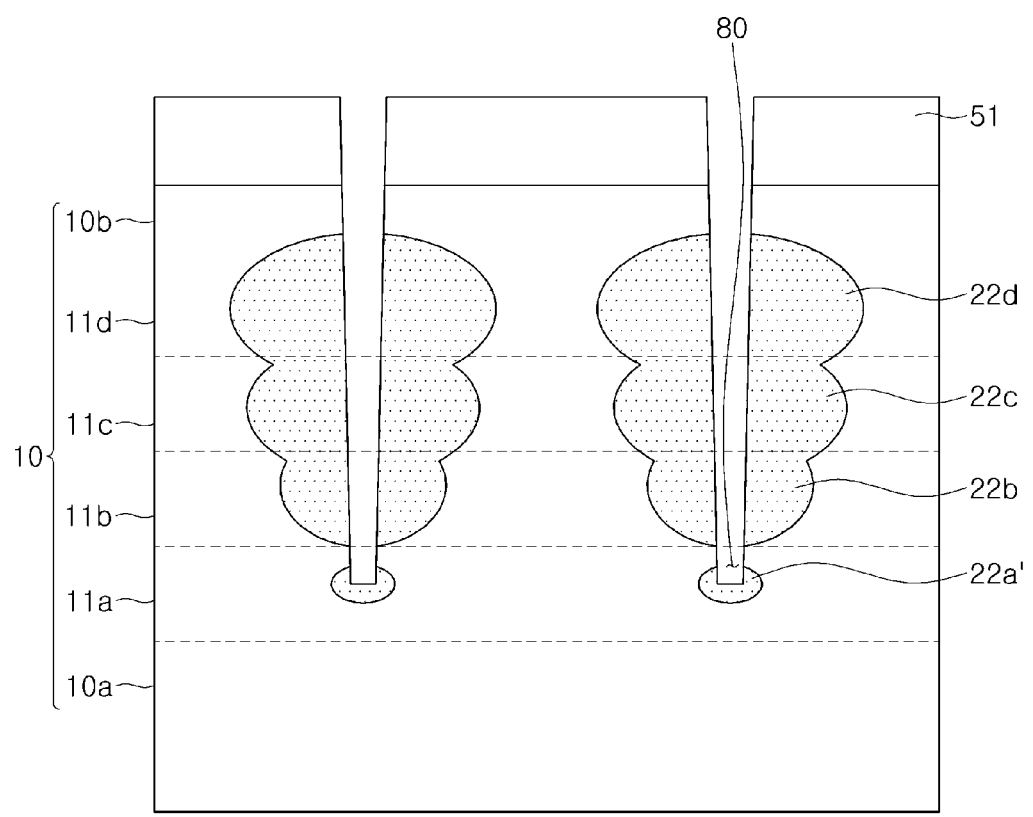
Figure 9F:
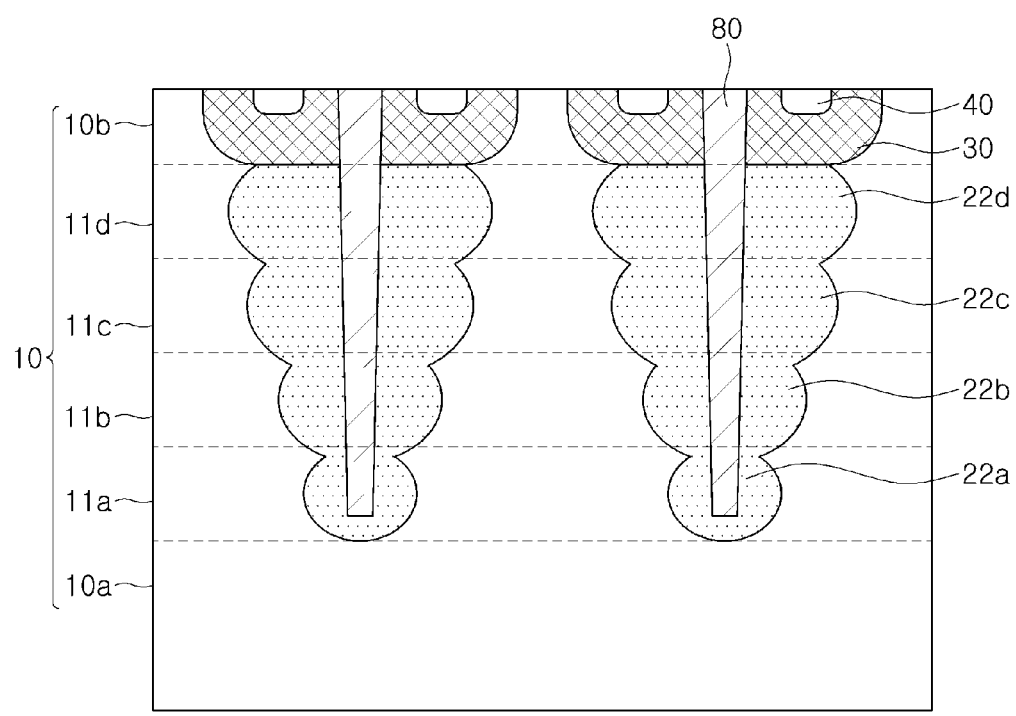

In addition, forming of the second semiconductor region 22c of the (n−1)$^{th}$ layer may be repeatedly performed until n−1 becomes 1 (See FIGS. 9C through 9E).

The method of manufacturing a power semiconductor device according to an exemplary embodiment of the present technology may further include, before the forming of the second semiconductor region 22d of the n$^{th}$ layer (See FIG. 9B), forming an insulating layer 51 on the first semiconductor region 10 except for portions at which the trenches 80 are formed.

That is, the insulating layer 51 may serve as a mask in the process of forming the trenches 80.

Figure 9G:
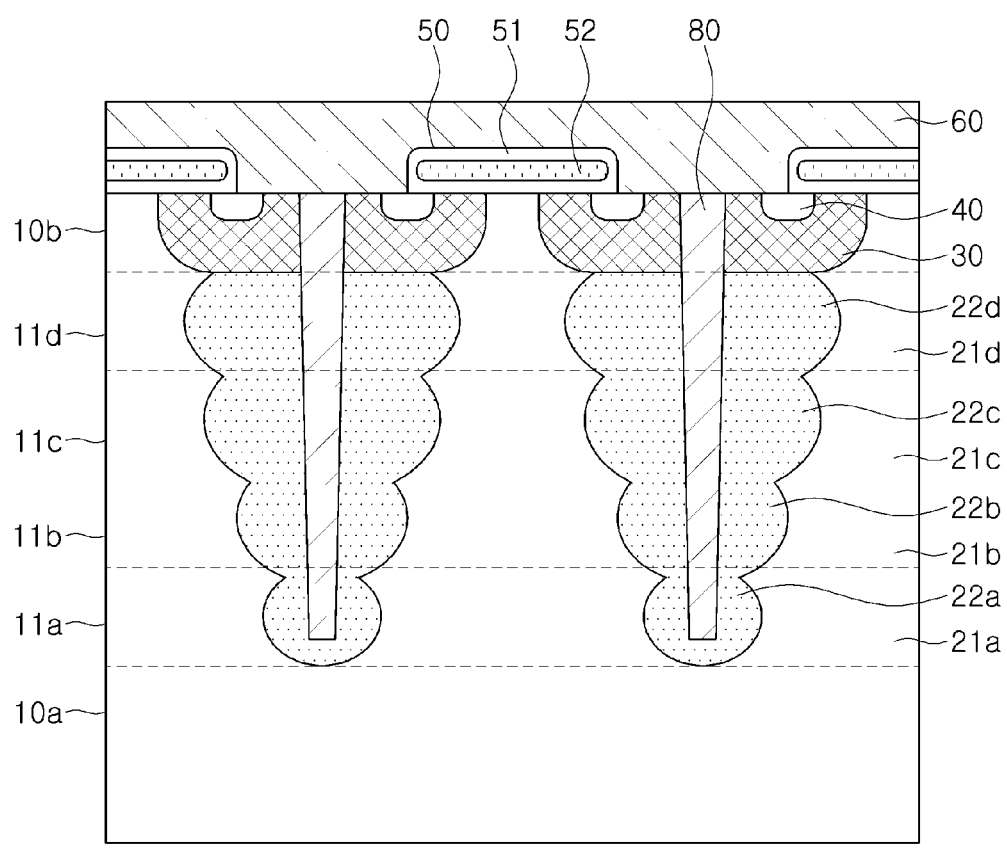

The method of manufacturing a power semiconductor device according to an exemplary embodiment of the present technology may further include, after forming of the source region 40 (See FIG. 9F), forming a gate 50 and a source metal layer 60 on the upper surface of the first semiconductor region 10 (See FIG. 9G).

Figure 9H:
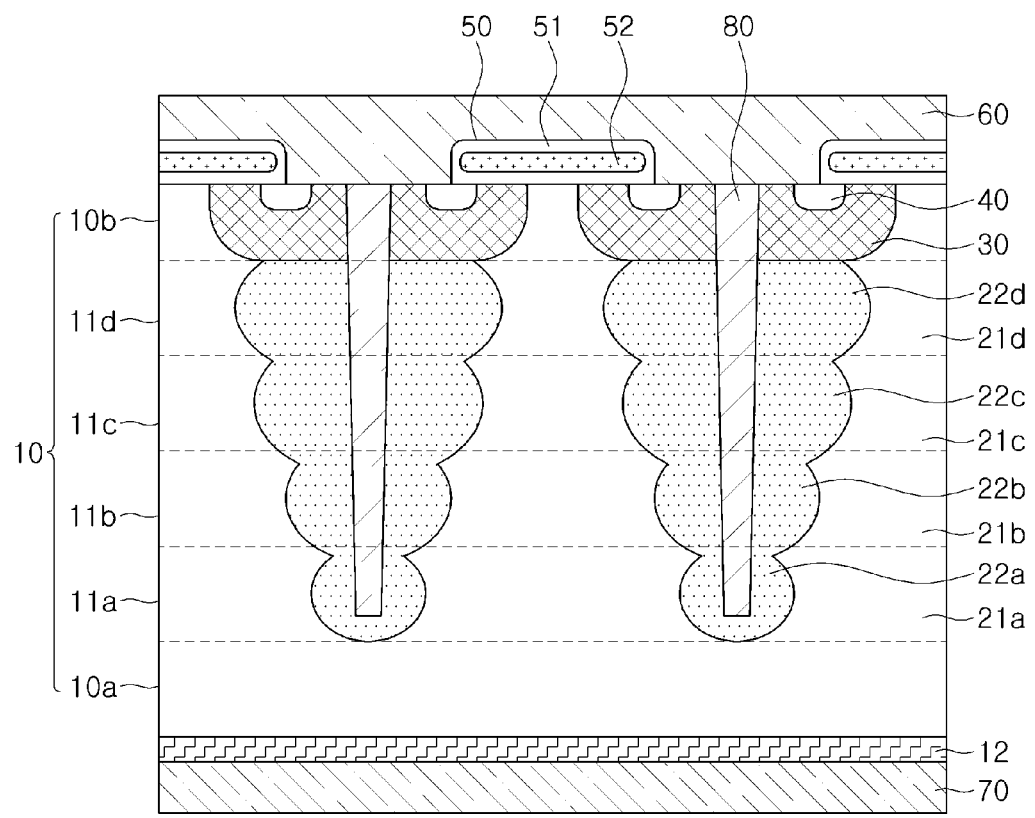

The method of manufacturing a power semiconductor device according to an exemplary embodiment of the present technology may further include, after forming of the gate 50 and the source metal layer 60 (See FIG. 9G), removing portions of a lower surface of the power semiconductor device, forming a buffer layer 12, and forming a drain metal layer 70 (See FIG. 9H).

Preparing the drift layer 10 may be performed by an epitaxial method.

The first conductivity type impurities may be of group V elements having five peripheral electrons, more specifically, phosphorus (P), arsenic (As), and the like.

The second conductivity type impurities may be of group III elements having three peripheral electrons, as one example, boron (B).

The etching process may be performed so that the trench has a tapered shape.

Since the trench 80 has the tapered shape, the width of an upper portion of the trench 80 may be wider than that of a lower portion thereof.

Therefore, in the process of forming the second semiconductor regions 22a, 22b, 22c, and 22d, the width of the semiconductor region formed at an upper portion in the thickness or width direction may be wider than that of the second semiconductor region formed at a lower portion in the thickness or width direction.

The fill material may be of the second conductivity type semiconductor material or silicon oxide, but is not limited thereto.

At least one of the steps of forming of the second semiconductor region of the n$^{th}$ layer and forming of the second semiconductor region of the (n−1)$^{th}$ layer may include implanting and heat treating the second conductivity type impurities.

That is, heat treatment may be performed to control the diffusion distance of the second conductivity type impurities that are implanted.

In forming the second semiconductor region of the n$^{th}$ layer and forming the second semiconductor region of the (n−1)$^{th}$ layer, in the case where a concentration of the second conductivity type impurities implanted into the n$^{th}$ layer is $I_n$, the impurities may be implanted so as to satisfy the following Equation: $I_1 < I_n$ (n≥2).

For example, in the case of performing a separate heat treatment process, etching process, and impurity implanting process in order to form the second semiconductor region 22c of the (n−1)$^{th}$ layer after implanting the impurities 22d' for forming the second semiconductor region 22d of the n$^{th}$ layer, the impurities 22d' for forming the second semiconductor region 22d of the n$^{th}$ layer may be diffused.

That is, in the case of repeatedly performing the above-mentioned processes until n−1 becomes 1, the impurities 22d' for forming the second semiconductor region 22d of the n$^{th}$ layer formed at the uppermost portion may be diffused most, such that the second semiconductor region 22d has the lowest concentration of impurities.

Therefore, the impurities may be implanted so as to satisfy the above Equation: $I_1 < I_n$ (n≥2), thereby allowing the concentration of the impurities of the second semiconductor region 22d of the n$^{th}$ layer not to be lower than that of the impurities of the second semiconductor region 22a of the first layer.

Figure 10:
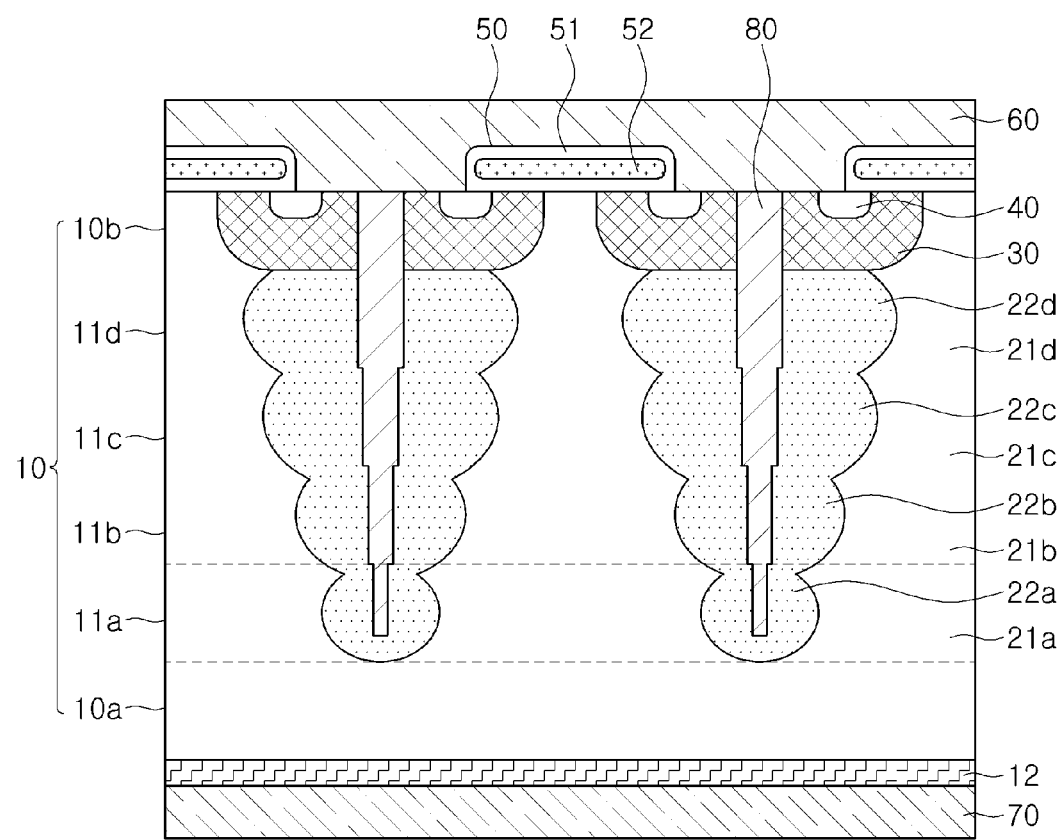
FIG. 10 is a schematic cross-sectional view of a power semiconductor device according to another exemplary embodiment of the present technology.

FIG. 10 is a schematic cross-sectional view of a power semiconductor device according to another exemplary embodiment of the present technology.

Referring to FIG. 10, a trench 80 of the power semiconductor device according to another exemplary embodiment of the present technology may have a stair shape.

The trench 80 may have a shape in which the width of an upper portion thereof is wider than that of a lower portion thereof.

That is, since the power semiconductor device according to another exemplary embodiment of the present technology has a shape in which the width of the upper portion of the trench 80 is wider than that of the lower portion, it may be manufactured so as to satisfy the following Equation $P_1 < P_n$ (n≥2) where the widest width of the second semiconductor regions 22a, 22b, 22c, and 22d of the first to $n^{th}$ layers is $P_n$.

In addition, in the case in which the trench has the stair shape, in a method of manufacturing a power semiconductor device according to an exemplary embodiment of the present technology, the implanting of the second conductivity type impurities may be performed by etching the $n^{th}$ to first RESURF layers 11d to 11a so that the trench 80 has the stair shape and vertically implanting the second conductivity type impurities into the upper surface of the power semiconductor device.

As set forth above, in the power semiconductor device according to exemplary embodiments of the present technology, since a width of the second semiconductor region positioned at an upper portion of the device is wider than that of the second semiconductor region positioned at a lower portion of the device, portions of the second semiconductor regions into which the depletion regions may be extended may be controlled such that the breakdown voltage may be improved.

Alternatively, since a concentration of the impurities of the second semiconductor region positioned at the upper portion of the device is higher than that of the second semiconductor region positioned at the lower portion of the device, the portions of the second semiconductor regions into which the depletion regions may be extended may be controlled, such that the breakdown voltage may be improved.

The regions into which the depletion regions may be extended may be controlled, such that the power semiconductor device according to an exemplary embodiment of the present technology may have a high breakdown voltage and a low forward voltage drop.

In addition, in the power semiconductor device according to an exemplary embodiment of the present technology, silicon oxide is filled in the trench extending through the second semiconductor region, such that boron, which is the preferred impurity of the second semiconductor region, may be precipitated.

Boron is precipitated where the trench and the second semiconductor region abut each other, such that the concentration of the second conductivity type impurities in the portion in which the second semiconductor region and the trench abut each other may be decreased.

That is, formation of a high concentration layer of second conductivity type impurities may be prevented, and the high concentration layer may prevent the depletion layer from being extended.

Therefore, the power semiconductor device according to an exemplary embodiment of the present technology may maintain the forward voltage drop at a low level and prevent the high concentration layer from being formed, such that the device may exhibit a high breakdown voltage and a low forward voltage drop.

While exemplary embodiments have been shown and described above, it will be apparent to those skilled in the art that modifications and variations could be made without departing from the spirit and scope of the present technology as defined by the appended claims.

What is claimed is:

1. A power semiconductor device comprising:
   a first semiconductor region of a first conductivity type having a top surface;
   second semiconductor regions formed in the first semiconductor region and being of a second conductivity type;
   a well region formed above the second semiconductor regions and being of the second conductivity type; and
   a source region formed in the well region and being of the first conductivity type, wherein the second semiconductor regions include 1 to n layers extending upwardly from a lower portion of the device, the widest width of the second semiconductor region of the $n^{th}$ layer is $P_n$, $P_1 < P_n$ (n≥2),
   a trench is formed to extend from the well region to a portion of the first layer of the second semiconductor regions, and
   a concentration of impurities in a portion of the second semiconductor region, positioned adjacently to the trench, is reduced toward the trench in a direction parallel to the top surface of the first semiconductor region.

2. The power semiconductor device of claim 1, wherein the widest width of the second semiconductor region of the $n^{th}$ layer is $P_n$, $P_{n-1} < P_n$ (n≥2).

3. The power semiconductor device of claim 1, wherein when a concentration of impurities at a portion at which a concentration of second conductivity type impurities is the highest in the direction of height of the device in the second semiconductor region of the n-th layer is $D_n$, $D_1 < D_n$ (n≥2).

4. The power semiconductor device of claim 1, wherein when a concentration of impurities at a portion at which a concentration of second conductivity type impurities is the highest in the direction of height of the device in the second semiconductor region of the $n^{th}$ layer is $D_n$, $D_{n-1} < D_n$ (n≥2).

5. The power semiconductor device of claim 1, wherein the trench has a gradually tapered shape such that an upper portion of the trench is wider than a width of a lower portion of the trench.

6. The power semiconductor device of claim 1, further comprising a gate contacting an upper surface of the source and well regions.

7. The power semiconductor device of claim 1, further comprising a gate including a gate oxide and a poly gate covered by the gate oxide.

8. A power semiconductor device comprising:
   a first semiconductor region of a first conductivity type having a top surface;
   second semiconductor regions formed in the first semiconductor region and being of a second conductivity type;
   a well region formed above the second semiconductor regions and being of the second conductivity type; and
   a source region formed in the well region and being of the first conductivity type, wherein the second semiconductor regions include 1 to n layers formed from a lower portion thereof in a direction of height of the device, wherein the power semiconductor device further comprises a trench extending through the well region and to a portion of the first layer of the second semiconductor region, and
   wherein a concentration of impurities in a portion of the second semiconductor region, positioned adjacently to the trench, is reduced toward the trench in a direction parallel to the top surface of the first semiconductor region.

9. The power semiconductor device of claim 8, wherein the trench has a width wider at an upper portion thereof than at a lower portion thereof.

10. The power semiconductor device of claim 9, wherein the trench has a tapered shape or a stair shape.

11. The power semiconductor device of claim 8, wherein the trench is filled with at least one of a second conductivity type material and silicon oxide.

12. A power semiconductor device comprising:
a first semiconductor region of a first conductivity type having a top surface;
second semiconductor regions formed in the first semiconductor region and of a second conductivity type;
a well region formed above the second semiconductor regions and of the second conductivity type; and
a source region formed in the well region and of the first conductivity type,
wherein the second semiconductor regions include 1 to n layers formed from a lower portion thereof in a direction of height of the device, a length of a longest gap, in a direction of width of the device, of a depletion region formed in the second semiconductor region of the nth layer is R., R1<R. (n>2), a trench is formed to extend from the well region to a portion of the first layer of the second semiconductor regions, and
a concentration of impurities in a portion of the second semiconductor region, positioned adjacently to the trench, is reduced toward the trench in a direction parallel to the top surface of the first semiconductor region.

13. The power semiconductor device of claim 12, wherein the length of the longest gap, in the direction of width of the device, of the depletion region formed in the second semiconductor region of the $n^{th}$ layer is $R_n$, $R_{n-1} < R_n$ ($n \geq 2$).

14. A power semiconductor device comprising:
a first semiconductor region of a first conductivity type having a top surface;
RESURF layers formed in the first semiconductor region and having second semiconductor regions and third semiconductor regions alternately formed in a direction of width of the device, the second semiconductor regions being of a second conductivity type and the third semiconductor regions being of the first conductivity type;
a well region formed above the second semiconductor regions and of the second conductivity type; and
a source region formed in the well region and of the first conductivity type, wherein the RESURF layers include 1 to n RESURF layers formed from a lower portion thereof in a direction of height of the device,
a length of a shortest portion, in the direction of width of the device, of the third semiconductor region formed in the nth RESURF layer is $Q_n$, $Q_1 > Q_n$ ($n \geq 2$), a trench formed to extend from the well region to a portion of the first RESURF layer,
a trench is formed to extend from the well region to a portion of the first RESURF layer, and
a concentration of impurities in a portion of the second semiconductor region, positioned adjacently to the trench, is reduced toward the trench in a direction parallel to the top surface of the first semiconductor region.

15. The power semiconductor device of claim 14, wherein the length of the shortest portion, in the direction of width of the device, of the third semiconductor region formed in the $n^{th}$ RESURF layer is $Q_n$, $Q_{n-1} > Q_n$ ($n \geq 2$).

16. The power semiconductor device of claim 14, wherein a concentration of impurities at a portion at which a concentration of second conductivity type impurities is the highest in the direction of height of the device in the second semiconductor region of the $n^{th}$ RESURF layer is $D_n$, $D_1 < D_n$ ($n \geq 2$).

17. The power semiconductor device of claim 16, wherein the concentration of impurities at a portion at which a concentration of second conductivity type impurities is the highest in the direction of height of the device in the second semiconductor region of the $n^{th}$ RESURF layer is $D_n$, $D_{n-1} < D_n$ ($n \geq 2$).

18. A power semiconductor device comprising:
a first semiconductor region of a first conductivity type having a top surface;
second semiconductor regions formed in the first semiconductor region and being of a second conductivity type;
a well region formed above the second semiconductor regions and of the second conductivity type; and
a source region formed in the well region and of the first conductivity type,
wherein the second semiconductor regions include first to nth layers formed from a lower portion thereof in a direction of height of the device,
wherein a length of the longest portion, in a direction of width of the device and a highest concentration of second conductivity type impurities in the direction of height of the device, in the second semiconductor region of the first to $n^{th}$ layers, are configured to prevent an extension of a depletion region formed in at least one second semiconductor region of the first to $n^{th}$ layers into the well region when a source-drain voltage is applied (n≥2), and a trench is formed to extend from the well region to a portion of the first layer of the second semiconductor regions, and
wherein a concentration of impurities in a portion of the second semiconductor region, positioned adjacently to the trench, is reduced toward the trench in a direction parallel to the top surface of the first semiconductor region.

19. The power semiconductor device of claim 18, wherein a distance between a boundary of the depletion region formed in the $n^{th}$ layer of the second semiconductor regions and a boundary of the second semiconductor region is shorter than a distance between a boundary of the depletion region formed in the first layer of the second semiconductor regions and a boundary of the second semiconductor region when the source-drain voltage is not applied.

20. The power semiconductor device of claim 19, wherein the distance between the boundary of the depletion region formed in the $n^{th}$ layer of the second semiconductor regions and the boundary of the second semiconductor region thereof is shorter than a distance between a boundary of the depletion region formed in the $(n-1)^{th}$ layer of the second semiconductor regions and a boundary of the second semiconductor region when the source-drain voltage is not applied.

21. A power semiconductor device comprising:
a first semiconductor region being of a first conductivity type having a top surface;
second semiconductor regions formed in the first semiconductor region and being of a second conductivity type;
a well region formed above the second semiconductor regions and being of the second conductivity type; and
a source region formed in the well region and being of the first conductivity type, wherein the second semiconductor regions include 1 to n layers formed upwardly from a lower portion of the device, when a concentration of the impurities in a portion in which the concentration of the second conductivity type impurities is the highest in the direction of height of the device in the second semiconductor region of the $n^{th}$ layer is $D_n$, $D_1<D_n$ (n≥2), a concentration of impurities in a portion of the second semiconductor region, positioned adjacently to the trench, is reduced toward the trench in a direction parallel to the top surface of the first semiconductor region.

22. The power semiconductor device of claim 21, wherein when the concentration of the impurities in the portion in which the concentration of the second conductivity type impurities is the highest in the direction of height of the device in the second semiconductor region of the $n^{th}$ layer is $D_n$, $D_{n-1}<D_n$ (n≥2).

23. The power semiconductor device of claim 21, wherein the trench has a gradually tapered shape such that an upper portion of the trench is wider than a width of a lower portion of the trench.

24. The power semiconductor device of claim 21, further comprising a gate contacting an upper surface of the source and well regions.

25. The power semiconductor device of claim 21, further comprising a gate including a gate oxide and a poly gate covered by the gate oxide.

* * * * *